US012677478B2

(12) United States Patent
Lee et al.

(10) Patent No.: US 12,677,478 B2
(45) Date of Patent: Jul. 7, 2026

(54) DISPLAY DEVICE

(71) Applicant: Samsung Display Co., LTD., Yongin-si (KR)

(72) Inventors: Seung Kyu Lee, Yongin-si (KR); Hoon Kim, Yongin-si (KR); Yong Sik Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 858 days.

(21) Appl. No.: 17/886,245

(22) Filed: Aug. 11, 2022

(65) Prior Publication Data

US 2023/0070620 A1      Mar. 9, 2023

(30) Foreign Application Priority Data

Sep. 8, 2021    (KR) ......................... 10-2021-0119899

(51) Int. Cl.
|  |  |
|---|---|
| *H10D 86/60* | (2025.01) |
| *H10D 86/40* | (2025.01) |
| *H10K 59/131* | (2023.01) |
| *H10W 70/60* | (2026.01) |
| *H10W 70/65* | (2026.01) |

(Continued)

(52) U.S. Cl.
CPC ........... *H10D 86/60* (2025.01); *H10D 86/441* (2025.01); *H10K 59/131* (2023.02); *H10W 90/00* (2026.01); *H10W 70/60* (2026.01); *H10W 70/65* (2026.01); *H10W 70/652* (2026.01); *H10W 70/654* (2026.01); *H10W 70/655* (2026.01); *H10W 72/90* (2026.01);

(Continued)

(58) Field of Classification Search
CPC .... H10D 86/451; H10D 86/441; H10D 86/60; H10K 59/131; G09G 2300/0426; G02F 1/136286; G02F 1/1345
See application file for complete search history.

(56) References Cited

U.S. PATENT DOCUMENTS

| | | | | |
|---|---|---|---|---|
| 6,104,465 A * | 8/2000 | Na | ......................... | G02F 1/1345 |
| | | | | 349/152 |
| 6,674,495 B1 * | 1/2004 | Hong | ................... | H10D 30/673 |
| | | | | 349/43 |

(Continued)

FOREIGN PATENT DOCUMENTS

KR         10-1627245 B1     6/2016

*Primary Examiner* — Samuel A Gebremariam
*Assistant Examiner* — Jonas T Beardsley
(74) *Attorney, Agent, or Firm* — Womble Bond Dickinson (US) LLP

(57) ABSTRACT

A display device includes: a substrate including a display area having a plurality of pixels, a pad area having a plurality of pads, and a non-display area including a fan-out area between the display area and the pad area; at least one first fan-out line in the fan-out area; at least one second fan-out line in the fan-out area and electrically disconnected from the first fan-out line; first, second, and third insulating layers sequentially arranged on the substrate; and a first conductive layer between the substrate and the first insulating layer, a second conductive layer on the second insulating layer, and a third conductive layer on the third insulating layer, wherein each of the first and second fan-out lines has a multi-layered stacking structure in which a first sub-line, a second sub-line, and a third sub-line provided in different layers are stacked.

20 Claims, 15 Drawing Sheets

(51) Int. Cl.

| | |
|---|---|
| *H10W 70/652* | (2026.01) |
| *H10W 70/654* | (2026.01) |
| *H10W 70/655* | (2026.01) |
| *H10W 72/90* | (2026.01) |
| *H10W 90/00* | (2026.01) |
| *H10W 90/22* | (2026.01) |

(52) U.S. Cl.
CPC ...... *H10W 72/922* (2026.01); *H10W 72/9415* (2026.01); *H10W 90/22* (2026.01); *H10W 90/734* (2026.01)

(56)          References Cited

U.S. PATENT DOCUMENTS

| | | | |
|---|---|---|---|
| 8,797,491 B2 | 8/2014 | Kim et al. | |
| 2008/0049156 A1* | 2/2008 | Kim .................. | G02F 1/136286 |
| | | | 349/40 |
| 2008/0203391 A1* | 8/2008 | Kim ..................... | G02F 1/1345 |
| | | | 257/E27.111 |
| 2018/0130856 A1* | 5/2018 | Kim .................... | H10K 59/353 |

* cited by examiner

LP1: LP1a, LP1b, LP1c
OVA: OVA1, OVA2, OVA3
L: L1, L2, L3

LP1: LP1a, LP1b, LP1c

LP2: LP2a, LP2b, LP2c
OVA': OVA1', OVA2', OVA3'
L: L4, L5, L6

LP2: LP2a, LP2b, LP2c

DISPLAY DEVICE

CROSS-REFERENCE TO RELATED APPLICATION

The present application claims priority to and the benefit of Korean Patent Application No. 10-2021-0119899 filed in the Korean Intellectual Property Office on Sep. 8, 2021, the entire content of which is incorporated herein by reference.

BACKGROUND

1. Field

Aspects of some embodiments of the present disclosure relate to a display device.

2. Description of the Related Art

Recently, as interest in an information display is increasing, research and development for display devices is continuously being conducted.

The above information disclosed in this Background section is only for enhancement of understanding of the background and therefore the information discussed in this Background section does not necessarily constitute prior art.

SUMMARY

Aspects of some embodiments of the present disclosure include a display device that may improve reliability by reducing a resistance deviation of fan-out lines.

According to some embodiments of the present disclosure, a display device includes: a substrate including a display area in which a plurality of pixels are located, a pad area in which a plurality of pads are located, and a non-display area including a fan-out area positioned between the display area and the pad area; at least one first fan-out line positioned in the fan-out area; at least one second fan-out line positioned in the fan-out area and electrically disconnected from the first fan-out line; first, second, and third insulating layers sequentially on the substrate; and a first conductive layer between the substrate and the first insulating layer, a second conductive layer on the second insulating layer, and a third conductive layer on the third insulating layer. The first fan-out line may be positioned to be closer to an edge of the non-display area than the second fan-out line.

According to some embodiments, each of the first and second fan-out lines may have a multi-layered stacking structure in which a first sub-line, a second sub-line, and a third sub-line provided in different layers are stacked. The first fan-out line and the second fan-out line may have the same length as each other.

According to some embodiments, the first sub-line may include the first conductive layer, the second sub-line may include the second conductive layer, and the third sub-line may include the third conductive layer.

According to some embodiments, in each of the first and second fan-out lines, the first sub-line and the second sub-line may overlap each other with the first and second insulating layers therebetween, and the second sub-line and the third sub-line may overlap each other with the third insulating layer therebetween.

According to some embodiments, in each of the first and second fan-out lines, the first sub-line and the second sub-line may be electrically connected through a first contact hole penetrating the first and second insulating layers. In each of the first and second fan-out lines, the second sub-line and the third sub-line may be electrically connected through a second contact hole penetrating the third insulating layer.

According to some embodiments, in each of the first and second fan-out lines, the second sub-line may directly contact the first sub-line through the first contact hole. In each of the first and second fan-out lines, the third sub-line may directly contact the second sub-line through the second contact hole.

According to some embodiments, in each of the first and second fan-out lines, the first contact hole and the second contact hole may not correspond to each other.

According to some embodiments, in an overlapping area of the first sub-line and the second sub-line of the second fan-out line may be larger than an overlapping area of the first sub-line and the second sub-line of the first fan-out line. An overlapping area of the second sub-line and the third sub-line of the second fan-out line may be larger than an overlapping area of the second sub-line and the third sub-line of the first fan-out line.

According to some embodiments, the pads may include at least one first pad electrically connected to the first sub-line of the first fan-out line; and at least one second pad electrically connected to the second sub-line of the second fan-out line. The first and second pads may include one of the first conductive layer, the second conductive layer, and the third conductive layer.

According to some embodiments, the first and second pads may include the third conductive layer, and may be provided on the same layer as the third sub-line of each of the first and second fan-out lines.

According to some embodiments, the first sub-line of the first fan-out line and the first pad may be electrically connected through a third contact hole penetrating the first insulating layer, the second insulating layer, and the third insulating layer.

According to some embodiments, the first sub-line of the second fan-out line and the second pad may be electrically connected through the third contact hole penetrating the first insulating layer, the second insulating layer, and the third insulating layer.

According to some embodiments, the first pad may be in direct contact with the first sub-line of the first fan-out line through the third contact hole, and the second pad may be in direct contact with the first sub-line of the second fan-out line through the third contact hole.

According to some embodiments, the first and second pads include the second conductive layer, and are provided on the same layer as the second sub-line of each of the first and second fan-out lines.

According to some embodiments, the first sub-line of the first fan-out line and the first pad may be electrically connected through a third contact hole penetrating the first and second insulating layers. The first sub-line of the second fan-out line and the second pad may be electrically connected through the third contact hole penetrating the first and second insulating layers.

According to some embodiments, in the second fan-out line, each of the first sub-line, the second sub-line, and the third sub-line may extend in one direction. A width of the first sub-line in a direction crossing the one direction may be larger than that of the second and third sub-lines.

According to some embodiments, in the second fan-out line, a size of an overlapping area of the first sub-line and the second sub-line may be different from a size of an overlapping area of the second sub-line and the third sub-line.

According to some embodiments, in the second fan-out line, the second sub-line may completely overlap the first sub-line with the first and second insulating layers therebetween.

According to some embodiments, in the first fan-out line, the first sub-line, the second sub-line, and the third sub-line may extend in an oblique direction inclined to the one direction.

According to some embodiments, the display device may further include a driver positioned in the non-display area and electrically connected to each of the first and second fan-out lines; and data lines electrically connected to the driver to transmit a data signal to each of the pixels. The third sub-line of each of the first and second fan-out lines may be integral with a corresponding one of the data lines.

According to some embodiments of the present disclosure, a display device includes: a substrate including a display area in which a plurality of pixels are located, a pad area in which a plurality of pads are located, and a non-display area including a fan-out area positioned between the display area and the pad area; at least one first fan-out line positioned in the fan-out area; at least one second fan-out line positioned in the fan-out area and electrically disconnected from the first fan-out line; first, second, and third insulating layers sequentially on the substrate; and a first conductive layer between the substrate and the first insulating layer, a second conductive layer on the second insulating layer, and a third conductive layer on the third insulating layer. The first fan-out line may be positioned to be closer to an edge of the non-display area than the second fan-out line.

According to some embodiments, each of the first and second fan-out lines may have a multi-layered stacking structure in which a first sub-line, a second sub-line, and a third sub-line that are provided in different layers and electrically connected are stacked. In each of the first and second fan-out lines, the first sub-line and the second sub-line may overlap each other, and the second sub-line and the third sub-line may overlap each other.

According to some embodiments, a size of an overlapping area of the first sub-line and the second sub-line may be different from a size of an overlapping area of the second sub-line and the third sub-line.

According to some embodiments of the present disclosure, a display device may include stacked structures having respective fan-out lines is differently designed according to positions of the fan-out lines in a fan-out area so that the fan-out lines have the same wire length and wire resistance regardless of the positions thereof.

In addition, according to some embodiments of the present disclosure, a display device may have relatively improved image quality by preventing or reducing distortion of a signal transmitted to pixels may be provided.

Characteristics and features of embodiments according to the present disclosure are not limited by what is illustrated in the above, and more various effects are included in the present specification.

DETAILED DESCRIPTION

Figure 1:
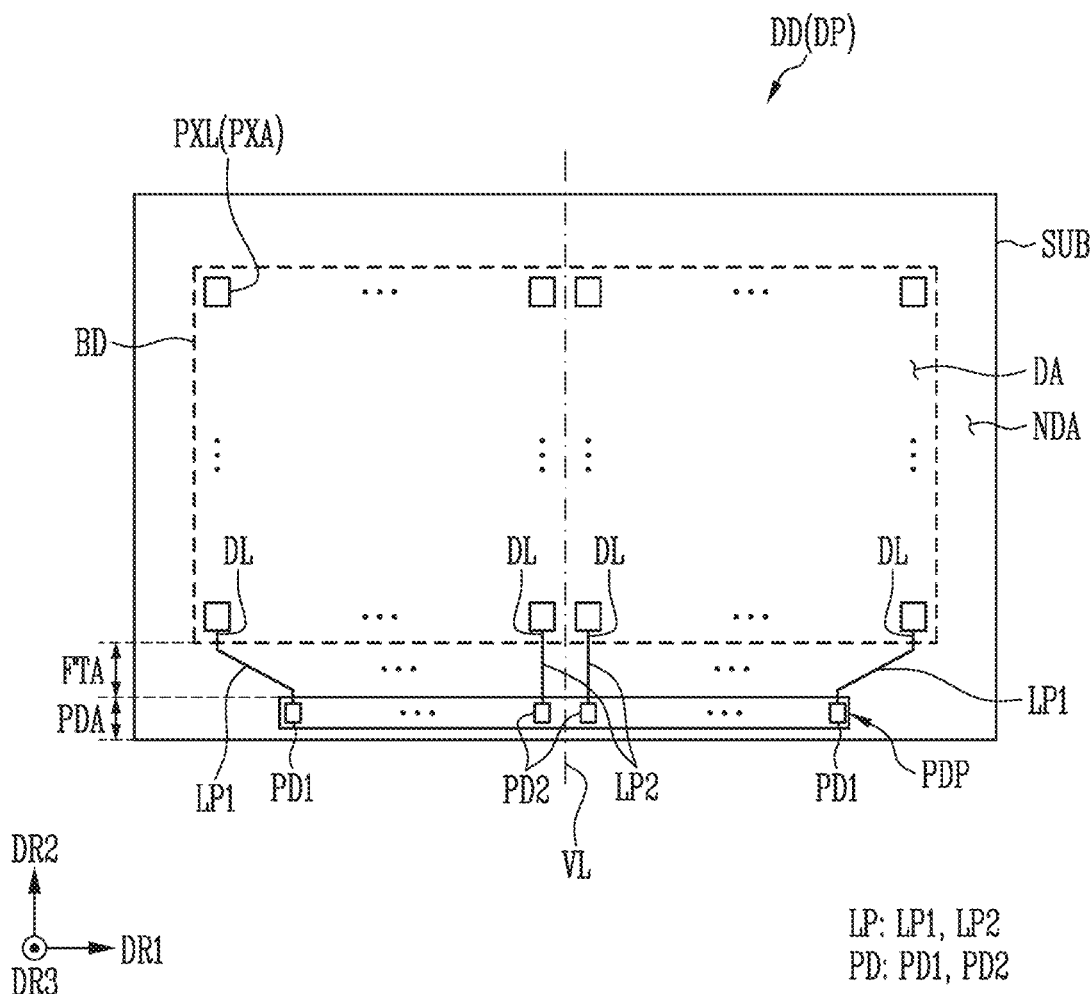
FIG. 1 and FIG. 2 illustrate schematic top plan views of a display device according to some embodiments.

Because embodiments according to the present disclosure may be variously modified and have various forms, aspects of some embodiments will be illustrated and described in more detail in the following. This, however, by no means restricts the disclosure to the specific embodiments, and it is to be understood as embracing all included in the scope of embodiments according to the present disclosure changes, equivalents, and substitutes.

Like reference numerals are used for like constituent elements in describing each drawing. In the accompanying drawings, the dimensions of the structure are exaggerated and shown for clarity of the present disclosure. Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the present disclosure.

In the present application, it should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance. It will be understood that when an element such as a layer, film, region, area, or substrate is referred to as being "on" another element, it can be directly on the other element or intervening elements may also be present. In addition, in the present specification, when an element of a layer, film, region, area, plate, or the like is referred to as being formed "on" another element, the formed direction is not limited to an upper direction but includes a lateral or lower direction. In contrast, when an element of a layer, film, region, plate, or the like is referred to as being "below" another element, it may be directly below the other element, or intervening elements may be present.

It is to be understood that, in the present application, when it is described for one constituent element (for example, a first constituent element) to be (functionally or communicatively) "coupled or connected with/to" another constituent element (for example, a second constituent element), the one constituent element may be directly coupled or connected with/to the another constituent element, or may be coupled or connected with/to through the other constituent element (for example, a third constituent element). In addition, in the present application, the term "connection" or "coupling" may comprehensively mean a physical and/or electrical connection or coupling.

Hereinafter, with reference to accompanying drawings, aspects of some embodiments of the present disclosure will be described in more detail. In the description below, singular forms are to include plural forms unless the context clearly indicates only the singular.

Figure 2:
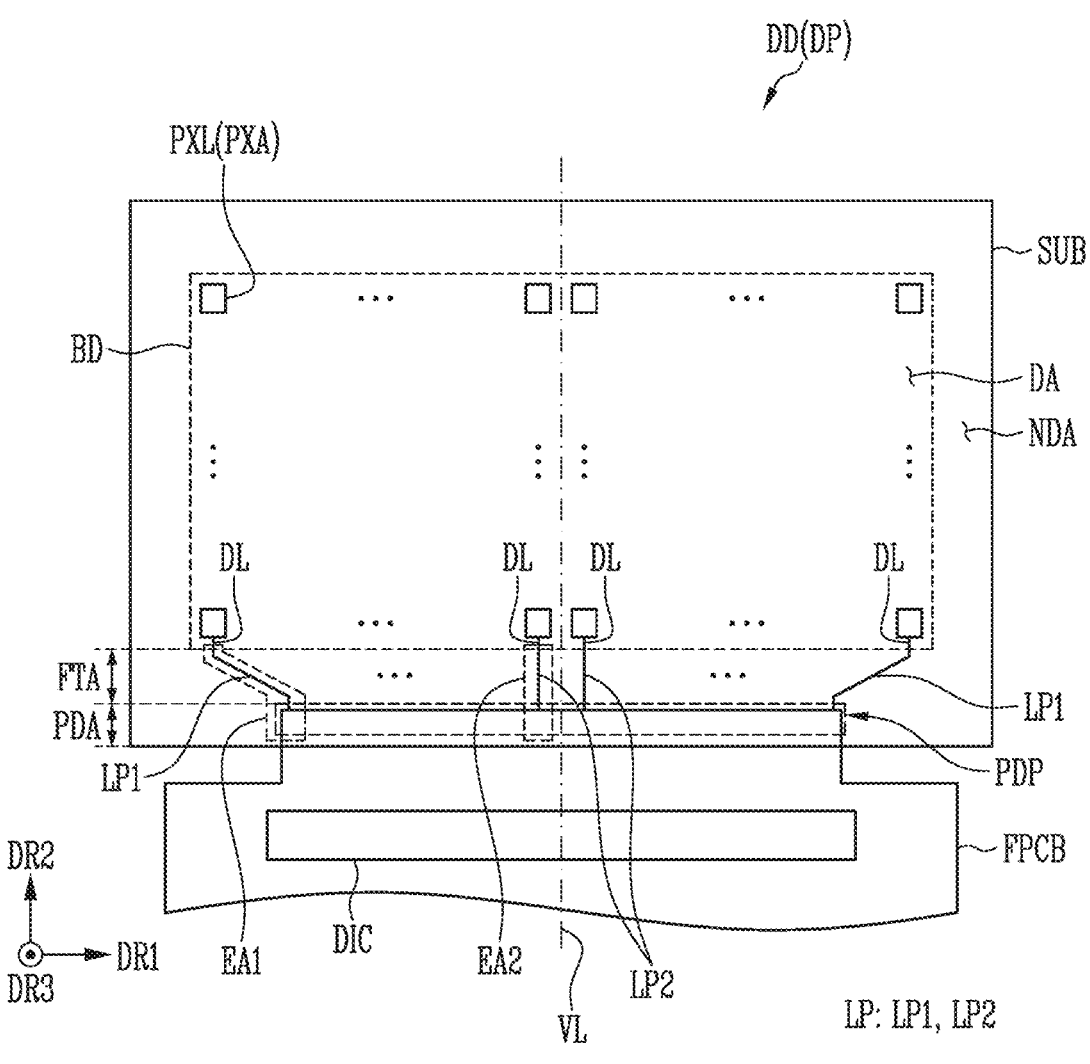

FIG. 1 and FIG. 2 illustrate schematic top plan views of a display device DD according to some embodiments.

In FIG. 1 and FIG. 2, for better understanding and ease of description, a structure of the display device DD, for example, of a display panel DP provided in the display device DD is briefly illustrated based on a display area DA in which images are displayed.

In the embodiments, "connection" between two elements mean both electrical and physical connections.

When the display device DD is one in which a display surface is applied to at least one surface thereof such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, or a wearable device, embodiments according to the present disclosure may be applied thereto.

Referring to FIG. and FIG. 2, the display device DD according to some embodiments may include a substrate SUB, a plurality of pixels PXL, and a wire part.

The display device DD may be provided in various shapes, and as an example, may be provided in a rectangular plate shape having two pairs of sides parallel to each other, but embodiments according to the present disclosure are not limited thereto. When the display device DD is provided in the rectangular plate shape, sides of one pair of the two pairs of sides may be provided to be longer than sides of the other pair there. In the drawings, the display device DD is shown to have an angled corner formed of a straight line, but is not limited thereto. According to some embodiments, in the display device DD provided in a shape of a rectangular plate, a corner portion at which one long side and one short side contact each other may have a round shape.

In FIG. 1 and FIG. 2, for better understanding and ease of description, a case in which the display device DD has a rectangular shape having a pair of long sides and a pair of short sides is illustrated, and an extending direction of the long side is indicated as a second direction DR2, an extending direction of the short side is indicated as a first direction DR1, and a thickness direction of the display device DD is indicated as a third direction DR3. The first to third directions DR1, DR2, and DR3 may mean directions indicated by the first to third directions DR1, DR2, and DR3, respectively.

The display panel DP may display an image. As the display panel DP, a self-emission display panel such as an organic light emitting display panel (OLED panel) using an organic light emitting diode as a light emitting element, a nano-scale (or nanometer) LED display panel using an ultra small light emitting diode as a light emitting element, or a quantum dot organic light emitting display panel (QD OLED panel) using a quantum dot and an organic light emitting diode may be used. In addition, as the display panel DP, a non-emission display panel such as a liquid crystal display panel (LCD panel), an electro-phoretic display panel (EPD panel), or an electro-wetting display panel (EWD panel) may be used. When a non-emission display panel is used as the display panel DP, the display device DD may include a backlight unit that supplies light to the display panel DP.

The substrate SUB may be formed of one area having an approximately rectangular shape. However, the number of areas provided in the substrate SUB may be different from the above-described example, and the shape of the substrate SUB may have a different shape depending on the area provided in the substrate SUB.

The substrate SUB may include a transparent insulating material to transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. However, the material included in the substrate SUB is not limited to the above-described embodiments.

The pixels PXL may be provided in the display area DA of the substrate SUB. Each of the pixels PXL may be provided in a pixel area PXA of the display area DA. Each of the pixels PXL may be a minimum unit that displays an image. The pixels PXL may include light emitting elements that emits white light and/or color light. Each of the pixels PXL may emit one color of red, green, and blue, but is not limited thereto, and may emit a color such as cyan, magenta, or yellow.

Each of the pixels PXL may include a light emitting element driven by a corresponding scan signal and data signal. The light emitting element may be, for example, an organic light emitting diode, but is not limited thereto. According to some embodiments, the light emitting element may be an inorganic light emitting element including an inorganic light emitting material or a light emitting element (quantum dot display element) that emits light by changing a wavelength of light emitted by using a quantum dot. For example, the organic light emitting diode may have a structure in which an anode, a hole transport layer (HTL), an organic emission layer, an electron transport layer (ETL), and a cathode are sequentially stacked, but embodiments according to the present disclosure are not limited thereto.

The pixels PXL may be arranged in a matrix configuration with one or more rows extending in the first direction DR1 and one or more columns extending in the second direction DR2 crossing the first direction DR1. However, the arrangement form of the pixels PXL is not particularly limited thereto, and the pixels PXL may be arranged in in any suitable configuration. In the drawing, the pixels PXL are shown to have a rectangular shape, but is not limited thereto, and may be changed in various shapes. In addition, when a plurality of pixels PXL are provided, they may be provided to have different areas (or sizes). For example, in the case in which the pixels PXL have different colors of emitted light, the pixels PXL for each color may be provided in different areas (or sizes) or in different shapes.

The substrate SUB may include a display area DA and a non-display area NDA. The display area DA may be an area in which pixels PXL are provided to display an image, and the non-display area NDA may be an area in which the pixels PXL are not provided and no image is displayed.

The non-display area NDA may be provided in at least one side of the display area DA. The non-display area NDA may surround a circumference (or edge) of the display area DA. The non-display area NDA may be provided with a portion of a wire part electrically connected to the pixels PXL, and a driver DIC that is electrically connected to the wire part and drives the pixels PXL.

The non-display area NDA may be an area in which wires (e.g., set or predetermined wires) (for example, fan-out lines LP), pads PD, and/or an embedded-in circuit part are electrically connected to the pixels PXL for driving the pixels PXL.

According to some embodiments, the non-display area NDA may include a fan-out area FTA and a pad area PDA.

The pad area PDA is an area of the non-display area NDA in which a pad part PDP is positioned, and may be positioned closest to an edge of the non-display area NDA. The fan-out area FTA is another area of the non-display area NDA in which the fan-out lines LP, which are a portion of the wire part, are positioned, and may be positioned adjacent to the display area DA in the non-display area NDA. For example, the fan-out area FTA may be an area of the non-display area NDA positioned between the pad area PDA and the display area DA. According to some embodiments, the non-display area NDA may include an antistatic circuit area in which an antistatic circuit that is electrically connected to the signal lines positioned in the display area DA to prevent or reduce static electricity generation is positioned. The antistatic circuit area may be an area of the non-display area NDA between the display area DA and the fan-out area FTA. In addition, in some embodiments, the non-display area NDA may include an area in which a demultiplexer is positioned.

The pad part PDP may be positioned in the pad area PDA, and the fan-out lines LP, which are a portion of the wire part, may be positioned in the fan-out area FTA.

The fan-out lines LP may be physically and/or electrically connected to data lines DL provided in the pixels PXL to transmit a signal (e.g., a set or predetermined signal) (for example, data signal) applied from the driver DIC to the data line DL. The fan-out lines LP may be connecting means that are positioned in the fan-out area FTA to electrically connect the driver DIC and the pixels PXL.

Each of the fan-out lines LP may be designed to have the same or substantially similar length and wire resistance to the adjacent fan-out lines LP.

According to some embodiments, the fan-out lines LP may include at least one or more first fan-out lines LP1 and at least one or more second fan-out lines LP2.

According to some embodiments, the first fan-out line LP1 may be electrically connected to some pixels PXL located adjacent to a boundary BD between the display area DA and the non-display area NDA among the pixels PXL. For example, the first fan-out line LP1 may be electrically connected to the data line DL of some pixels PXL positioned at the outermost of the display area DA among the pixels PXL. In other words, the first fan-out line LP1 may be some fan-out lines LP positioned adjacent to an edge of the non-display area NDA among the fan-out lines LP.

The first fan-out line LP1 may be positioned at the outermost of the fan-out area FTA. The first fan-out line LP1 may include an oblique portion inclined in the first direction DR1 (or the second direction DR2).

According to some embodiments, the second fan-out line LP2 may be adjacent to a imaginary line VL positioned at a center (or middle) of the display area DA so as to divide the display area DA into two equal areas in the first direction DR1, or may be electrically connected to some overlapping pixels PXL, among the pixels PXL. For example, the second fan-out line LP2 may be electrically connected to the data line DL of some pixels PXL that are positioned adjacent to or overlap the imaginary line VL (or the pixels PXL positioned at the middle of the display area DA), among the pixels PXL. The imaginary line VL may extend along the second direction DR2.

The second fan-out line LP2 may include only a straight line portion positioned adjacent to or overlapping the imaginary line VL in the fan-out area FTA and extending in a direction parallel to the second direction DR2. For example, the second fan-out line LP2 may have a straight shape (or a bar shape) extending in a direction parallel to the second direction DR2.

According to some embodiments, the fan-out lines LP including the first fan-out line LP1 and the second fan-out line LP2 have the same wire length or substantially similar wire length to each other regardless of their position in the fan-out area FTA, and may be designed to have the same wire resistance or substantially similar wire resistance. This will be described in more detail later with reference to FIG. 6 to FIG. 14.

The pad part PDP may include a plurality of pads PD. The pads PD may supply (or transmit) driving power sources and signals for driving the pixels PXL and/or the embedded circuit part provided in the display area DA. In some embodiments, when the driver DIC is mounted on the non-display area NDA of the substrate SUB, the pad part PDP overlaps output pads of a driver (IC) to receive signals outputted from the driver (IC).

The pads PD may include at least one or more first pad PD1 and at least one or more second pad PD2.

The first pad PD1 may be electrically connected to the first fan-out line LP1. In this case, the first pad PD1 may supply (or transmit) driving power sources and signals to some pixels PXL electrically connected to the first fan-out line LP1. For example, when the first fan-out line LP1 is a data fan-out line electrically connected to the data line DL provided in some pixels PXL, the first pad PD1 may be electrically connected to the first fan-out line LP1 to supply a data signal to the data line DL of some pixels PXL.

The second pad PD2 may be electrically connected to the second fan-out line LP2. In this case, the second pad PD2 may supply (or transmit) driving power sources and signals to some pixels PXL electrically connected to the second fan-out line LP2. For example, when the second fan-out line LP2 is a data fan-out line electrically connected to the data line DL provided in some pixels PXL, the second pad PD2 may be electrically connected to the second fan-out line LP2 to supply a data signal to the data line DL of some pixels PXL.

The display device DD may further include a circuit board FPCB electrically connected to the display panel DP through the pad part PDP. The circuit board FPCB may be a flexible circuit board, but is not limited thereto.

The circuit board FPCB may process various signals inputted from a printed circuit board to output them to the display panel DP. To this end, one end of the circuit board FPCB may be attached to the display panel DP, and the other end of the circuit board FPCB facing the one end may be attached to the printed circuit board. The circuit board FPCB may be electrically connected to each of the display panel DP and the printed circuit board by a conductive adhesive member. The conductive adhesive member may include an anisotropic conductive film.

The driver DIC may be positioned on the circuit board FPCB. The driver DIC may include input/output pads electrically connected to the pads PD included in the pad part PDP. For example, the driver DIC may be an integrated circuit (IC). The driver DIC may receive the driving signals outputted from the printed circuit board, and may output signals (e.g., set or predetermined signals) and a voltage of a driving power source (e.g., a set or predetermined driving power source) to be provided to the pixels PXL based on the received driving signals. The above-described signals (e.g., set or predetermined signals) and voltage (e.g., set or predetermined voltage) of the driving power source may be supplied to the corresponding pads PD of the pad part PDP through some of the input/output pads.

Figure 3:
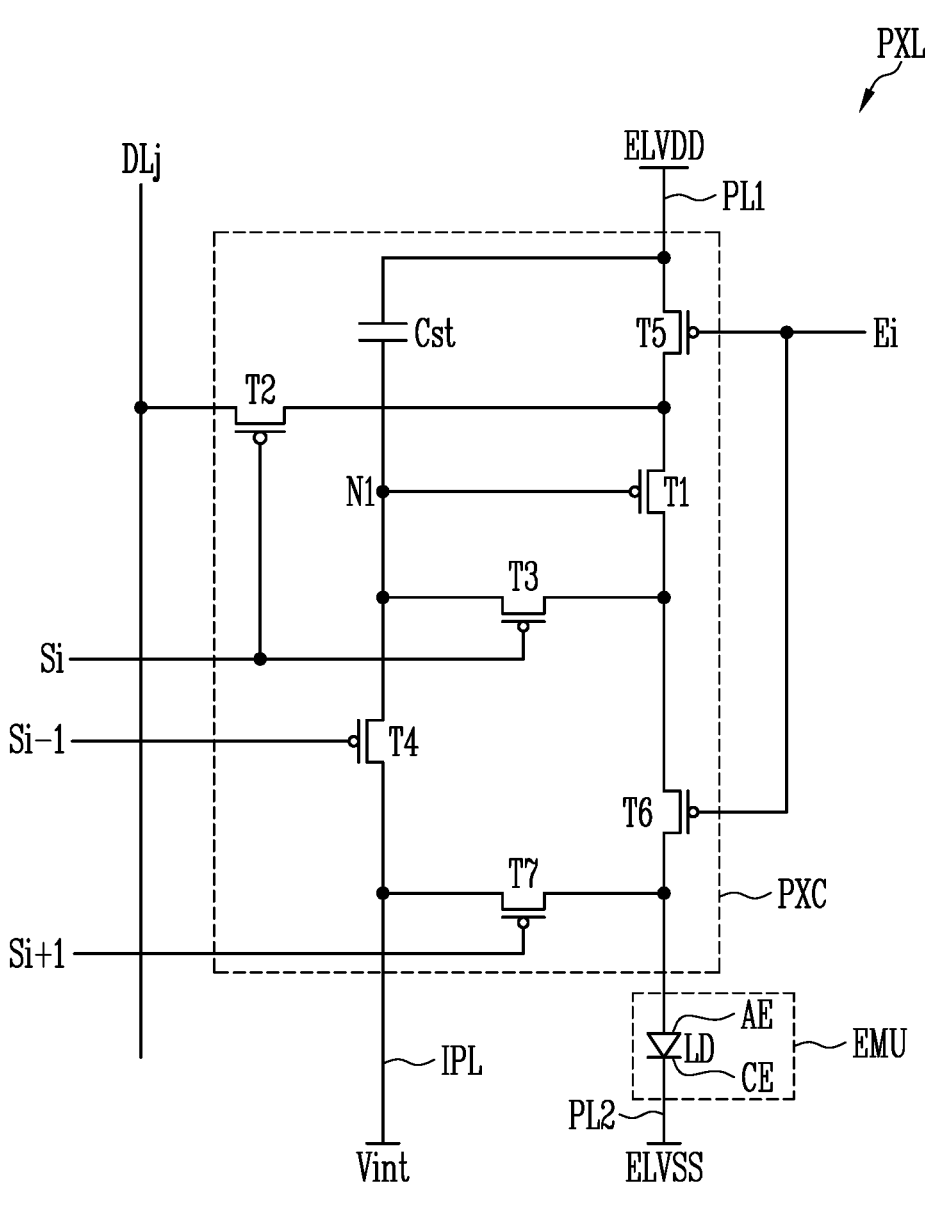
FIG. 3 and FIG. 4 illustrate circuit diagrams of an electrical connection relationship of constituent elements included in a pixel illustrated in FIG. 1 according to some embodiments.
Figure 4:
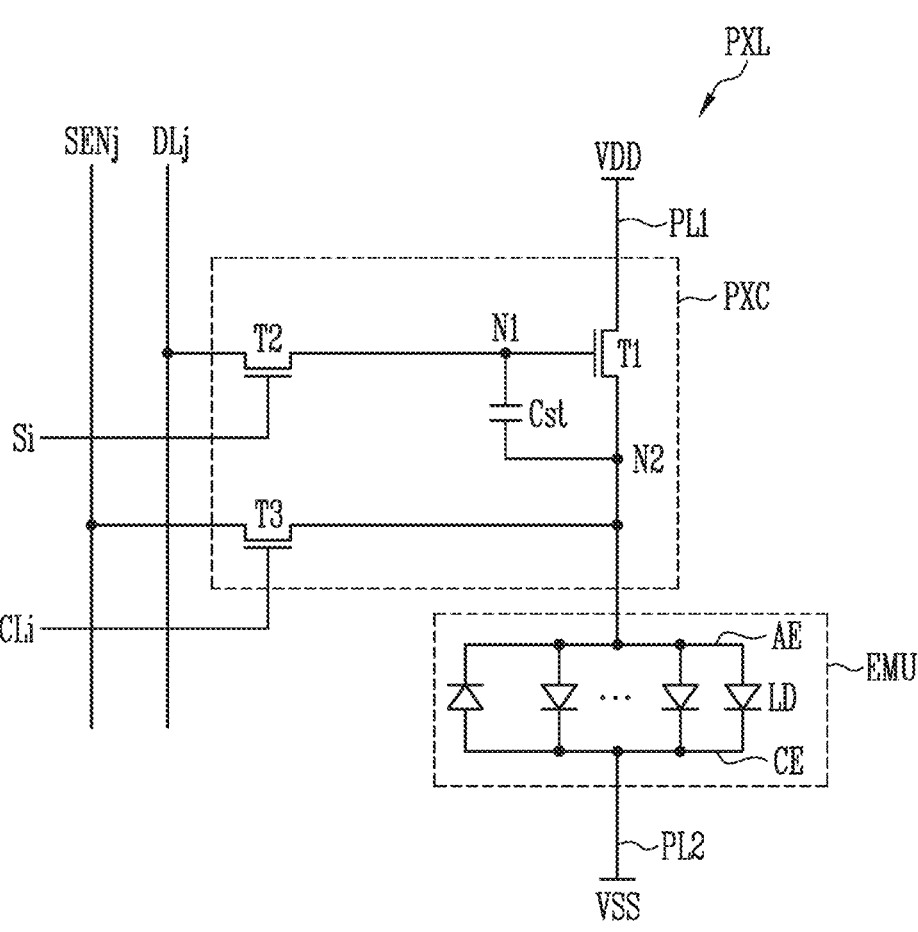

FIG. 3 and FIG. 4 illustrate circuit diagrams of an electrical connection relationship of constituent elements included in the pixel PXL illustrated in FIG. 1 according to some embodiments.

For example, FIG. 3 and FIG. 4 illustrate an electrical connection relationship between constituent elements included in the pixel PXL applicable to an active display device according to some embodiments. However, the types of constituent elements included in the pixel PXL to which the embodiments of the present disclosure may be applied are not limited thereto.

In FIG. 3 and FIG. 4, not only constituent elements included in the pixel but also an area in which the constituent elements are provided are comprehensively referred to as the pixel PXL.

In FIG. 3, the pixel PXL may include a pixel circuit PXC and a light emitting element LD, and the light emitting element LD may be an organic light emitting diode (OLED). In FIG. 4, the pixel PXL may include the pixel circuit PXC and the light emitting element LD, and the light emitting element LD may be a plurality of ultra-small inorganic light emitting diodes having a structure in which a nitride-based semiconductor is grown and that are as small as a micro-scale (or micrometer) to a nano-scale (or nanometer).

FIG. 3 and FIG. 4 illustrate the pixel PXL located in an i-th row (or pixel row) and a j-th column (or pixel column) of the display area DA of the display panel DP.

First of all, referring to FIG. 1 to FIG. 3, the pixel PXL may include a emission unit EMU (or light emitting part) including the light emitting element LD and the pixel circuit (PXC) for driving the light emitting element LD. According to some embodiments, the light emitting element LD may be an organic light emitting diode (OLED), but is not limited thereto.

The pixel circuit PXC may be electrically connected to a scan line Si, an emission control line Ei, and a data line DLj of the corresponding pixel PXL. According to some embodiments, the pixel circuit PXC may be electrically connected to at least other scan lines. For example, the pixel circuit PXC may be electrically connected to an (i–1)-th scan line Si–1 and/or an (i+1)-th scan line Si+1. In addition, in some embodiments, the pixel circuit PXC may be electrically connected to first and second pixel power sources ELVDD and ELVSS and an initialization power source Vint.

The pixel circuit PXC may include first to seventh transistors T1 to T7 and a storage capacitor Cst.

One electrode of the first transistor T1 (or driving transistor), for example, a source electrode thereof, may be electrically connected to a first power line PL1 to which the first pixel power source ELVDD is applied via the fifth transistor T5, and the other electrode thereof, for example, a drain electrode thereof may be electrically connected to the light emitting element LD of the emission unit EMU via the sixth transistor T6. In addition, a gate electrode of the first transistor T1 may be electrically connected to a first node N1. The first transistor T1 may control a driving current flowing between the first pixel power source ELVDD and the second pixel power source ELVSS via the light emitting element LD in response to a voltage of the first node N1.

The second transistor T2 (or switching transistor) may be electrically connected between a data line Dj electrically connected to the pixel PXL and the source electrode of the first transistor T1. In addition, a gate electrode of the second transistor T2 may be electrically connected to the scan line Si electrically connected to the pixel PXL. When a scan signal of a gate-on voltage (for example, a low voltage) is supplied from the scan line Si, the second transistor T2 may be turned on to electrically connect the data line DLj to the source electrode of the first transistor T1. Accordingly, when the second transistor T2 is turned on, a data signal supplied from the data line DLj may be transmitted to the first transistor T1.

The third transistor T3 may be electrically connected between the drain electrode of the first transistor T1 and the first node N1. In addition, a gate electrode of the third transistor T3 may be electrically connected to the scan line Si. When the scan signal of the gate-on voltage is supplied from the scan line Si, the gate electrode of the third transistor T3 may be turned on to electrically connect the drain electrode of the first transistor T1 to the first node N1.

The fourth transistor T4 may be electrically connected between the first node N1 and an initialization power line IPL to which the initialization power source Vint is applied. A gate electrode of the fourth transistor T4 may be electrically connected to a previous scan line, for example, the (i–1)-th scan line Si–1. When the scan signal of the gate-on voltage is supplied to the (i–1)-th scan line Si–1, the fourth transistor T4 may be turned on to transmit a voltage of the initialization power source Vint to the first node N1. Here, the initialization power source Vint may have a voltage smaller than or equal to a lowest voltage of the data signal.

The fifth transistor T5 may be electrically connected between the first power line PL1 to which the first pixel power source ELVDD is applied and the first transistor T1. In addition, a gate electrode of the fifth transistor T5 may be electrically connected to a corresponding emission control line Ei. When an emission control signal of a gate-off voltage is supplied to the emission control line Ei, the fifth transistor T5 may be turned off, and otherwise, it be turned on.

The sixth transistor T6 may be electrically connected between the first transistor T1 and the light emitting element LD. In addition, a gate electrode of the sixth transistor T6 may be electrically connected to the emission control line Ei. When the emission control signal of the gate-off voltage is supplied to the emission control line Ei, the sixth transistor T6 may be turned off, and otherwise, it be turned on.

The seventh transistor T7 may be electrically connected between the light emitting element LD and the initialization power line IPL to which the initialization power Vint is applied. In addition, a gate electrode of the seventh transistor T7 may be electrically connected to one of the scan lines in a next stage, for example, to the (i+1)-th scan line Si+1. When the scan signal of the gate-on voltage is supplied to the (i+1)-th scan line Si+1, the seventh transistor T7 may be turned on to supply a voltage of the initialization power source Vint to the light emitting element LD. The timing of the gate-on voltage may be the same as the i-th scan signal applied to the i-th scan line Si.

The storage capacitor Cst may be electrically connected between the first power line PL1 to which the first pixel power source ELVDD is applied and the first node N1. The storage capacitor Cst may store a data signal and a voltage corresponding to a threshold voltage of the first transistor T1.

A first electrode AE (or anode) of the light emitting element LD may be electrically connected to the first transistor T1 via the sixth transistor T6, and a second electrode CE thereof (or cathode) may be electrically connected to a second power line PL2 to which the second pixel power source ELVSS is applied. The emission unit EMU including the first electrode AE, the light emitting element LD, and the second electrode CE described above emits light of a luminance (e.g., a set or predetermined luminance) corresponding to an amount of current supplied from the first transistor T1. A voltage value of the first pixel power source ELVDD may be set to be higher than that of the second pixel power source ELVSS so that a current flows through the light emitting element LD.

The light emitting element LD may be, for example, an organic light emitting diode. The light emitting element LD may emit light of one of red, green, and blue. However, embodiments according to the present disclosure are not limited thereto.

FIG. 3 illustrates embodiments in which all of the first to seventh transistors T1 to T7 included in the pixel circuit PXC are P-type transistors, but embodiments according to the present disclosure are not limited thereto. In some the embodiments, all of the first to seventh transistors T1 to T7 may be changed to N-type transistors, or some thereof may be changed to N-type transistors.

The structure of the pixel circuit PXC is not limited to the embodiments shown in FIG. 3. For example, a pixel circuit PXC of various structures currently known may be applied to the pixel PXL.

Hereinafter, each pixel PXL including a plurality of light emitting elements LD having a structure in which a nitride-based semiconductor is grown will be described with reference to FIG. 4.

Referring to FIG. 1, FIG. 2, and FIG. 4, the pixel PXL may include a emission unit (EMU) (or emission portion) that generates light with luminance corresponding to a data signal. In addition, the pixel PXL may further selectively include the pixel circuit PXC for driving the emission unit EMU.

In some embodiments, the emission unit EMU may include at least one or more light emitting elements LD electrically connected between the first power line PL1 to which the voltage of the first driving power source VDD is applied and the second power line PL2 to which the voltage of the second driving power source VSS is applied. For example, the emission unit EMU may include a plurality of light emitting elements LD electrically connected to between the first electrode AE and the second electrode CE. According to some embodiments, the first electrode AE may be and anode, and the second electrode CE may be a cathode.

Each of the light emitting elements LD included in the emission unit EMU may include first and second semiconductor layers formed of different types of semiconductor layers, and an active layer interposed therebetween. For example, each of the light emitting elements LD may be implemented as a light emitting stacked body in which a first semiconductor layer, an active layer, and a second semiconductor layer are sequentially stacked in one direction. Here, the first semiconductor layer may be an N-type semiconductor layer, and the second semiconductor layer may be a P-type semiconductor layer.

The light emitting elements LD included in the emission unit EMU may include a first end portion electrically connected to the first driving power source VDD through the first electrode AE and a second end portion electrically connected to the second driving power source VSS through the second electrode CE. The first driving power source VDD and the second driving power source VSS may have different potentials. For example, the first driving power source VDD may be set as a high potential power source, and the second driving power source VSS may be set as a low potential power source. In this case, a potential difference between the first and second driving power sources VDD and VSS may be set to be equal to or higher than a threshold voltage of the light emitting element LD during a light emitting period of the pixel PXL.

As described above, the light emitting element LD electrically connected between the first electrode AE and the second electrode CE to which voltages of different potentials are respectively supplied may configure an effective light source, and may implement the emission unit EMU of the pixel PXL.

The light emitting element LD may emit light with luminance corresponding to a driving current supplied through the pixel circuit PXC. For example, during each frame period, the pixel circuit PXC may supply a driving current corresponding to a grayscale value of corresponding frame data to the emission unit EMU. The driving current supplied to the emission unit EMU may flow in the light emitting element LD. Accordingly, while the light emitting element LD emits light with a luminance corresponding to the driving current, the emission unit EMU may emit light.

The pixel circuit PXC may be electrically connected to a scan line Si and a data line DLj of the pixel PXL. In addition, the pixel circuit PXC may be electrically connected to a control line CLi and a sensing line SENj of the pixel PXL.

The pixel circuit PXC may include the first to third transistors T1 to T3 and the storage capacitor Cst.

The first transistor T1 is a driving transistor for controlling a driving current applied to the emission unit EMU, and may be electrically connected between the first driving power source VDD and the emission unit EMU. Specifically, a first terminal of the first transistor T1 may be electrically connected to the first driving power source VDD through the first power line PL1, a second terminal of the first transistor T1 may be electrically connected to a second node N2, and a gate electrode of the first transistor T1 may be electrically connected to the first node N1. The first transistor T1 may control an amount of the driving current applied to the emission unit EMU from the first driving power source VDD through the second node N2 according to a voltage applied to the first node N1. According to some embodiments, the first terminal of the first transistor T1 may be a drain electrode, and the second terminal of the first transistor T1 may be a source electrode, but the present disclosure is not limited thereto. In some embodiments, the first terminal thereof may be a source electrode, and the second terminal thereof may be a drain electrode.

The second transistor T2 is a switching transistor that selects the pixel PXL in response to a scan signal and activates the pixel PXL, and may be electrically connected between the data line DLj and the first node N1. A first terminal of the second transistor T2 may be electrically connected to the data line DLj, a second terminal of the second transistor T2 may be electrically connected to the first node N1, and a gate electrode of the second transistor T2 may be electrically connected to the scan line Si. The first terminal and the second terminal of the second transistor T2 are different terminals, and for example, when the first terminal is a drain electrode, the second terminal may be a source electrode.

When a scan signal of a gate-on voltage (for example, a high level voltage) is supplied from the scan line Si, the second transistor T2 may be turned on to electrically connect the data line DLj and the first node N1. The first node N1 is a point at which the second terminal of the second transistor T2 is electrically connected to the gate electrode of the first transistor T1, and the second transistor T2 may transmit a data signal to the gate electrode of the first transistor T1.

The third transistor T3 connects the first transistor T1 to the sensing line SENj, so that it may obtain a sensing signal through the sensing line SENj, and may detect a characteristic of the pixel PXL in addition to a threshold voltage of the first transistor T1 by using the sensing signal. Information on the characteristics of the pixel PXL may be used to convert image data so that a characteristic difference between the pixels PXL may be compensated.

A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to the control line CLi. In addition, the first terminal of the third transistor T3 may be electrically connected to the initialization power source. The third transistor T3 is an initialization transistor capable of initializing the second node N2, and when a sensing control signal is supplied from the control line CLi, the third transistor T3 may be turned on to transmit a voltage of the initialization power source to the second node N2. Accordingly, a second storage electrode of the storage capacitor Cst electrically connected to the second node N2 may be initialized.

A first storage electrode of the storage capacitor Cst may be electrically connected to the first node N1, and the second storage electrode of the storage capacitor Cst may be electrically connected to the second node N2. The storage capacitor Cst is charged with a data voltage corresponding to the data signal supplied to the first node N1 during one frame period. Accordingly, the storage capacitor Cst may store a voltage corresponding to a difference between a voltage of the gate electrode of the first transistor T1 and a voltage of the second node N2.

In FIG. 4, the embodiments in which the light emitting elements LD configuring the emission unit EMU are all electrically connected in parallel is illustrated, but is not limited thereto. In some embodiments, the emission unit EMU may be configured to include at least one series stage including a plurality of light emitting elements LD electrically connected in parallel to each other.

In FIG. 4, embodiments in which the first, second, and third transistors T1, T2, and T3 included in the pixel circuit PXC are all N-type transistors are illustrated, but embodiments according to the present disclosure are not limited thereto. According to some embodiments, at least one of the first, second, or third transistors T1, T2, or T3 described above may be changed to a P-type transistor.

The structure of the pixel PXL that may be applied to embodiments according to the present disclosure are not limited to the embodiments illustrated in FIG. 3 and FIG. 4, and the corresponding pixel PXL may have various structures.

Figure 5A:
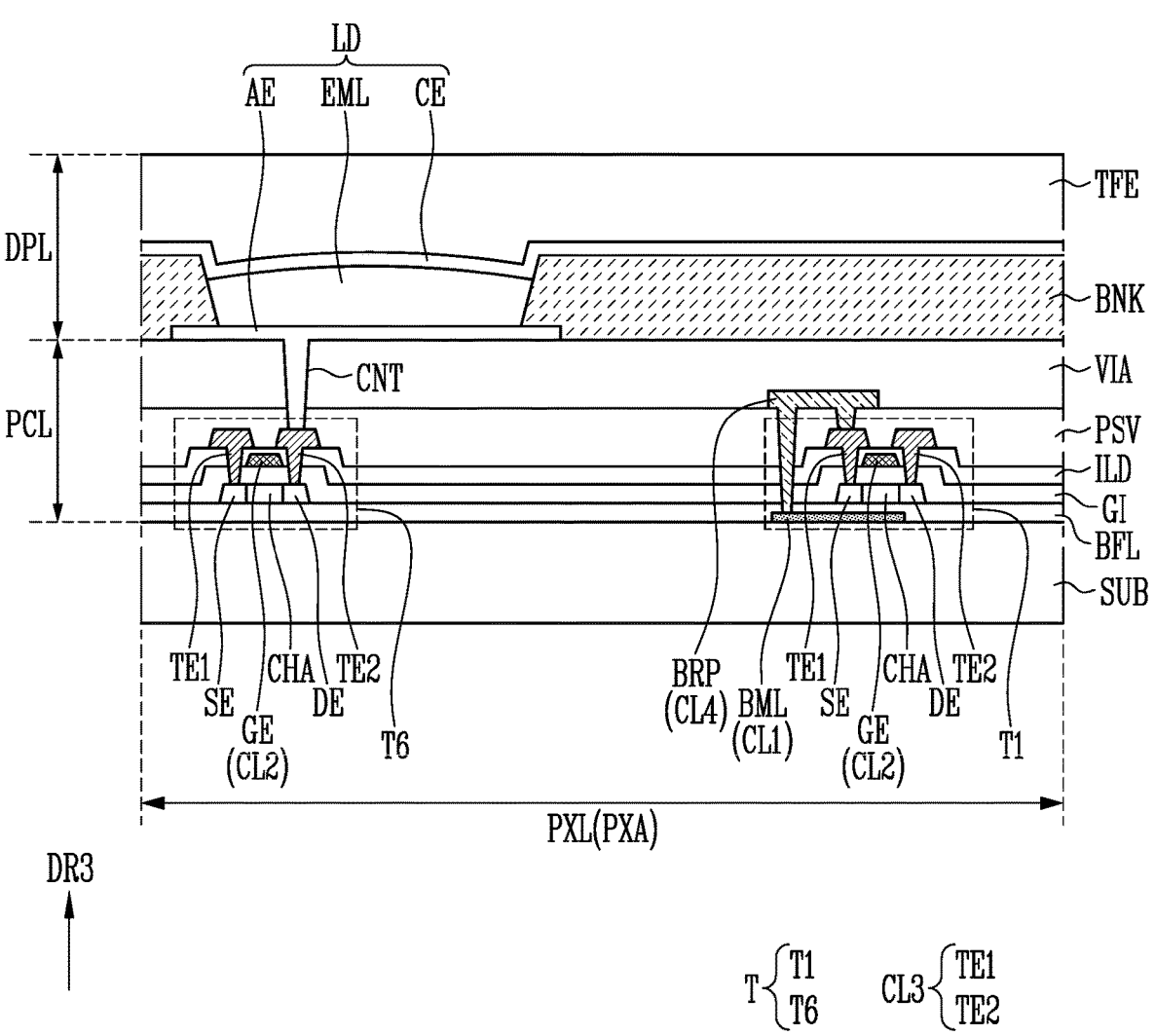
FIG. 5A and FIG. 5B illustrate schematic cross-sectional views of a pixel according to some embodiments.
Figure 5B:
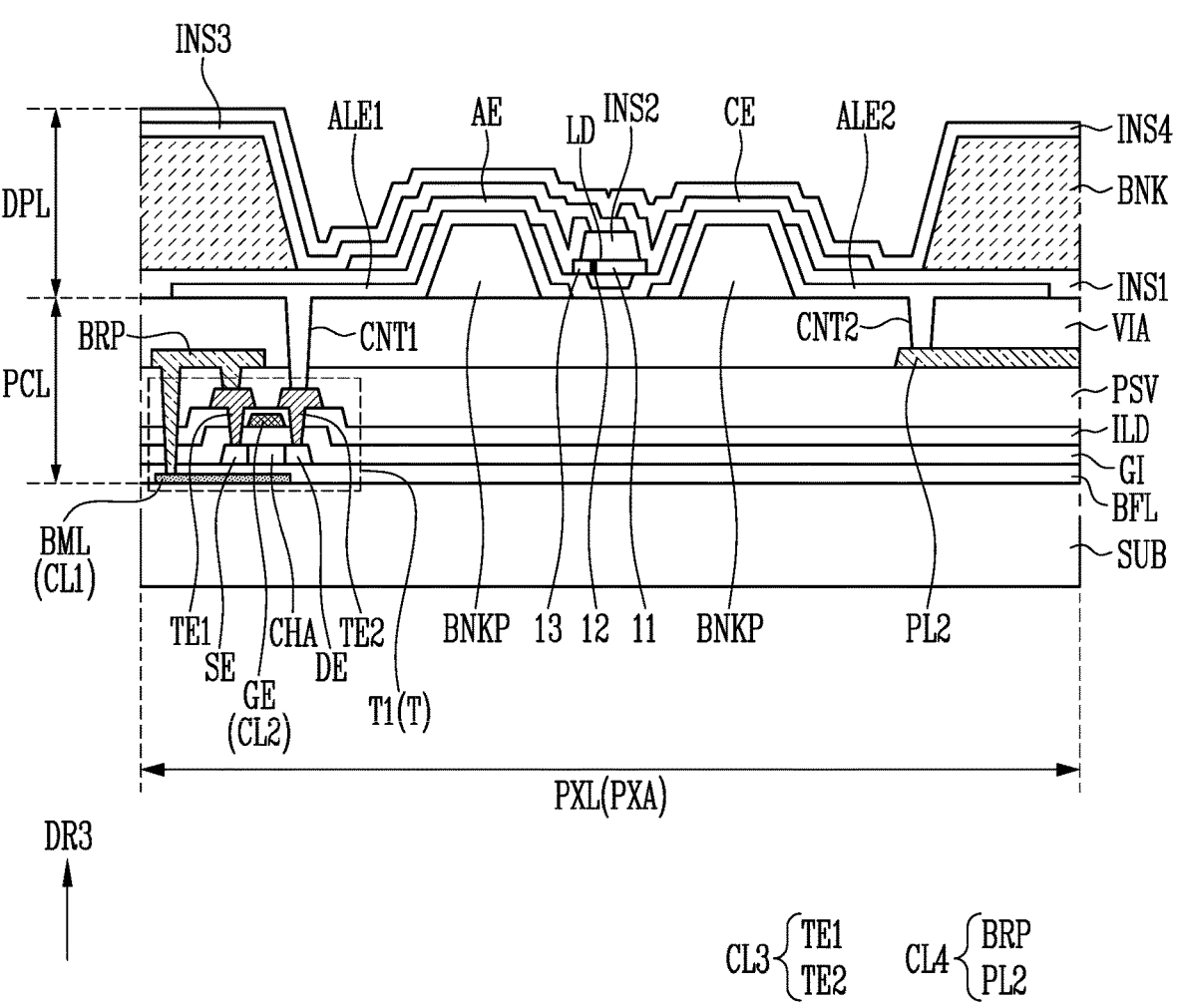

FIG. 5A and FIG. 5B illustrate schematic cross-sectional views of the pixel PXL according to some embodiments.

In FIG. 5A and FIG. 5B, for better comprehension and ease of description, a thickness direction of the substrate SUB is indicated as the third direction DR3. The third direction DR3 may mean a direction indicated by the third direction DR3.

For convenience, FIG. 5A illustrates only a cross-sectional view of a portion corresponding to each of the first and sixth transistors among the first to seventh transistors T1 to T7 illustrated in FIG. 3, and FIG. 5B illustrates only the driving transistor T corresponding to the first transistor T1 among the first to third transistors T1, T2, and T3 illustrated in FIG. 4.

Hereinafter, the pixel PXL illustrated in FIG. 5A will be first described, and then the pixel PXL illustrated in FIG. 5B will be described later.

Referring to FIG. 1 to FIG. 3 and FIG. 5A, the pixel PXL may be positioned in the pixel area PXA provided in the substrate SUB.

The pixel PXL may include the substrate SUB, a pixel circuit layer PCL, and a display element layer DPL.

The pixel circuit layer PCL and the display element layer DPL may be arranged to overlap each other on one surface of the substrate SUB. For example, the display area DA of the substrate SUB may include the pixel circuit layer PCL arranged on one surface of the substrate SUB, and the display element layer DPL arranged on the pixel circuit layer PCL. However, mutual positions of the pixel circuit layer PCL and the display element layer DPL on the substrate SUB may be changed according to embodiments. When the pixel circuit layer PCL and the display element layer DPL are designed as separate layers to overlap each other, each layout space for forming the pixel circuit PXC and the emission unit EMU on a plane is sufficiently secured, so that a high-resolution and high-definition display device may be easily implemented.

The substrate SUB may include a transparent insulating material to transmit light. The substrate SUB may be a rigid substrate or a flexible substrate.

In each pixel area PXA of the pixel circuit layer PCL, circuit elements (for example, transistors T) configuring the pixel circuit PXC of the corresponding pixel PXL and signal lines (e.g., set or predetermined signal lines) electrically connected to the circuit elements may be arranged. In addition, the light emitting element LD and the first and second electrodes AE and CE configuring the emission unit EMU of the corresponding pixel PXL may be arranged in each pixel area PXA of the display element layer DPL.

The pixel circuit layer PCL may include at least one insulating layer in addition to the circuit elements and the signal lines. For example, the pixel circuit layer PCL may include a buffer layer BFL, a gate insulating layer GI, an interlayer insulating layer ILD, a passivation layer PSV, and a via layer PSV that are sequentially stacked along the third direction DR3 on the substrate SUB. In addition, the pixel circuit layer PCL may include conductive layers located between the above-described insulating layers. For example, the pixel circuit layer PCL may include a first conductive layer CL1 located between the substrate SUB and the buffer layer BFL, a second conductive layer CL2 located on the gate insulating layer GI, a third conductive layer CL3 located on the interlayer insulating layer ILD, and a fourth conductive layer CL4 located on the passivation layer PSV.

The buffer layer BFL may be entirely provided and/or formed on the substrate SUB. The buffer layer BFL may be a first insulating layer of the pixel circuit layer PCL located on the substrate SUB. The buffer layer BFL may prevent or reduce impurities being diffused into the transistor T included in the pixel circuit PXC. The buffer layer BFL may be an inorganic insulating film including an inorganic material. The buffer layer BFL may include at least one of metal oxides such as a silicon nitride ($SiN_x$), a silicon oxide ($SiO_x$), a silicon oxynitride ($SiO_xN_y$), or an aluminum oxide ($AlO_x$). The buffer layer BFL may be provide as a single layer, but may also be provide as a multilayer of at least double layers or more. When the buffer layer BFL is provided as multiple layers, respective layers thereof may be made of the same material or different materials. The buffer layer BFL may be omitted depending on the material, a process condition, and the like of the substrate SUB.

The transistor T may include a first transistor T1 controlling a driving current of the light emitting element LD and a sixth transistor T6 electrically connected to the light emitting element LD.

Each of the first and sixth transistors T1 and T6 may include an active pattern (or semiconductor layer) and a gate electrode GE overlapping a portion of the active pattern. Here, the active pattern may include a channel area CHA, a first contact area SE, and a second contact area DE.

The gate electrode GE may be the second conductive layer CL2 provided and/or formed on the gate insulating layer GI. The gate electrode GE may be formed to have a single film structure of a single or a mixture thereof selected from a group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double film or multi-film structure of molybdenum (Mo), titanium (Ti), copper (Cu), aluminum (Al) or silver (Ag), which are a low-resistance material.

The gate insulating layer GI may be entirely provided and/or formed on the active pattern and buffer layer BFL. The gate insulating layer GI may be a second insulating layer of the pixel circuit layer PCL stacked on the substrate SUB. The gate insulating layer GI may be an inorganic insulating film including an inorganic material. For example, the gate insulating layer GI may include at least one of metal oxides such as a silicon nitride ($SiN_x$), a silicon oxide ($SiO_x$), a silicon oxynitride ($SiO_xN_y$), or an aluminum oxide ($AlO_x$). However, the material of the gate insulating layer GI is not limited to the above-described embodiments. In some embodiments, the gate insulating layer GI may be formed as an organic insulating film including an organic material. The gate insulating layer GI may be provided as a single layer, and may be provided as a multilayer of at least double layers or more.

The active pattern may be made of a poly silicon, an amorphous silicon, an oxide semiconductor, or the like. The channel area CHA, the first contact area SE, and the second contact area DE may be formed of a semiconductor layer in which an impurity is not doped or an impurity is doped. For example, the first contact area SE and the second contact area DE may be formed of a semiconductor layer doped with an impurity, and the channel area CHA may be formed of a semiconductor layer that is not doped with an impurity.

The channel area CHA of each of the first and sixth transistors T1 and T6 may be an area of an active pattern overlapping the gate electrode GE of the corresponding transistor T. For example, the channel area CHA of the first transistor T1 may be an area of an active pattern overlapping the gate electrode GE of the first transistor T1, and the channel area CHA of the sixth transistor T6 may be an area of an active pattern overlapping the gate electrode GE of the sixth transistor T6.

The first contact area SE of each of the first and sixth transistors T1 and T6 may be electrically connected (or contacted) to one end of the channel area CHA. The first contact area SE of each of the first and sixth transistors T1 and T6 may be electrically connected to a first connecting member TE1.

The first connecting member TE1 may be the third conductive layer CL3 provided and/or formed on the interlayer insulating layer ILD. The first connecting member TE1 may be electrically and/or physically connected to the first contact area SE of each of the first and sixth transistors T1 and T6 through a contact hole sequentially penetrating the interlayer insulating layer ILD and the gate insulating layer GI. According to some embodiments, the first connecting member TE1 electrically connected to the first contact area SE of the first transistor T1 may be electrically and/or physically connected to a bridge pattern BRP through a contact hole penetrating the passivation layer PSV positioned on the interlayer insulating layer ILD.

The first connecting member TE1 may include the same material as that of the gate electrode GE, or may include one or more materials selected from the materials illustrated as constituent materials of the gate electrode GE.

The interlayer insulating layer ILD may be entirely provided and/or formed on the gate electrode GE and the gate insulating layer GI. The interlayer insulating layer ILD may be a third insulating layer of the pixel circuit layer PCL stacked on the substrate SUB. The interlayer insulating layer ILD may include the same material as that of the gate insulating layer GI, or may include one or more materials selected from the materials illustrated as constituent materials of the gate insulating layer GI.

The bridge pattern BRP may be a fourth conductive layer CL4 provided and/or formed on the passivation layer PSV. The bridge pattern BRP may be electrically connected to the first contact area SE of the first transistor T1 through the first connecting member TE1. In addition, the bridge pattern BRP may be electrically and/or physically connected to a bottom metal layer BML through a contact hole that sequentially penetrates the passivation layer PSV, the interlayer insulating layer ILD, the gate insulating layer GI, and the buffer layer BFL. The bottom metal layer BML and the first contact area SE of the first transistor T1 may be electrically connected through the bridge pattern BRP and the first connecting member TE1.

The bottom metal layer BML may be a first conductive layer among the conductive layers located on the substrate SUB. For example, the bottom metal layer BML may be the first conductive layer CL1 positioned between the substrate SUB and the buffer layer BFL. The bottom metal layer BML may be electrically connected to the first transistor T1 to extend a driving range of a voltage (e.g., a set or predetermined voltage) supplied to the gate electrode GE of the first transistor T1. For example, the bottom metal layer BML may be electrically connected to the first contact area SE of the first transistor T1 to stabilize the channel area of the first transistor T1. In addition, as the bottom metal layer BML is electrically connected to the first contact area SE of the first transistor T1, floating of the bottom metal layer BML may be prevented or reduced.

The second contact area DE of each of the first and sixth transistors T1 and T6 may be electrically connected (or contacted) to the other end of the channel area CHA of the corresponding transistor T. For example, the second contact area DA of the first transistor T1 may be electrically connected to the other end of the channel area CHA of the first transistor T1, and the second contact area DE of the sixth transistor T6 may be electrically connected to the other end of the channel area CHA of the sixth transistor T6. In addition, the second contact area DE of each of the first and sixth transistors T1 and T6 may be electrically connected (or contacted) to a second connecting member TE2.

The second connecting member TE2 may be the third conductive layer CL3 provided and/or formed on the interlayer insulating layer ILD. The second connecting member TE2 may be electrically and/or physically connected to the second contact area DE of each of the first and sixth transistors T1 and T6 through a contact hole penetrating the interlayer insulating layer ILD and the gate insulating layer GI.

According to some embodiments, the second connecting member TE2 electrically connected to the second contact area DE of the sixth transistor T6 may be electrically and/or physically connected to some components of the display element layer DPL through a contact portion CNT sequentially passing through the via layer VIA and the passivation layer PSV. The second connecting member TE2 may be a medium for electrically connecting the sixth transistor T6 of the pixel circuit layer PCL and some components of the display element layer DPL.

In the above-described embodiments, the case in which each of the first and sixth transistors T1 and T6 is a thin film transistor having a top gate structure has been described as an example, but embodiments according to the present disclosure are not limited thereto, and the structure of each of the first and sixth transistors T1 and T6 may be variously changed.

The passivation layer PSV may be provided and/or formed on the first and sixth transistors T1 and T6 and the first and second connecting members TE1 and TE2.

The passivation layer PSV (or protective layer) may be entirely provided and/or formed on the first and second connecting members TE1 and TE2 and the interlayer insulating layer ILD. The passivation layer PSV may be a fourth insulating layer of the pixel circuit layer PCL stacked on the substrate SUB. The passivation layer PSV may be an inorganic insulating film including an inorganic material or an organic insulating film including an organic material. The inorganic insulating film may include, for example, at least one of metal oxides such as a silicon oxide ($SiO_x$), a silicon nitride ($SiN_x$), a silicon oxynitride ($SiO_xN_y$), or an aluminum oxide ($AlO_x$). The organic insulating film may be, for example, at least one of a polyacrylates resin, an epoxy resin, a phenolic resin, a polyamides resin, a polyimides rein, an unsaturated polyesters resin, a poly-phenylen ethers resin, a poly-phenylene sulfides resin, or a benzocyclobutene resin.

In some embodiments, the passivation layer PSV may include the same material as the interlayer insulating layer ILD, but is not limited thereto. The passivation layer PSV may be provided as a single layer, but may also be provide as a multilayer of at least double layers or more.

The via layer VIA may be provided and/or formed on the fourth conductive layer CL4 (for example, the bridge pattern BRP).

The via layer VIA may be include an organic insulating film, an inorganic insulating film, or the organic insulating film located on the inorganic insulating film. The inorganic insulating film may include, for example, at least one of metal oxides such as a silicon oxide ($SiO_x$), a silicon nitride ($SiN_x$), a silicon oxynitride ($SiO_xN_y$), or an aluminum oxide ($AlO_x$). The organic insulating film may be, for example, at least one of a polyacrylates resin, an epoxy resin, a phenolic resin, a polyamides resin, a polyimides rein, an unsaturated polyesters resin, a poly-phenylen ethers resin, a poly-phenylene sulfides resin, or a benzocyclobutene resin.

The via layer VIA may include a contact portion CNT corresponding to the contact portion CNT of the passivation layer PSV exposing the second connecting member TE2 electrically connected to the sixth transistor T6.

The display element layer DPL may be provided and/or formed on the via layer VIA.

The display element layer DPL may include the light emitting element LD that is located on the via layer VIA and emits light. The light emitting element LD may include the first and second electrodes AE and CE, and an emission layer EML provided between the two electrodes AE and CE. In this case, one of the first and second electrodes AE and CE may be an anode, and the other thereof may be a cathode. When the light emitting element LD is a top light emitting type of organic light emitting diode, the first electrode AE may be a reflective electrode, and the second electrode CE may be a transmissive electrode. Hereinafter, a case in which the light emitting element LD is the top light emitting type of organic light emitting diode and the first electrode AE is the anode will be described as an example.

The first electrode AE may be electrically connected to the sixth transistor T6 through the contact portion CNT passing through the via layer VIA and the passivation layer PSV and the second connecting member TE2. The first electrode AE may include a reflective film capable of reflecting light or a transparent conductive film located above or below the reflective film. For example, the first electrode AE may be formed as a multi-film including a lower transparent conductive film made of an indium tin oxide (ITO), a reflective film located on the lower transparent conductive film and made of Ag, and an upper transparent conductive film located on the reflective film and made of an indium tin oxide (ITO). At least one of the transparent conductive film or the reflective film may be electrically connected to the driving transistor T.

The display element layer DPL may further include a bank BNK provided with an opening exposing a portion of the first electrode AE, for example, an upper surface of the first electrode AE. The bank BNK may have a structure that defines (or partitions) a pixel area or light emitting area of each of the pixel PXL and a pixel adjacent thereto, and for example, it may be a pixel defining film. The bank BNK may include an inorganic insulating film including an inorganic material or an organic insulating film including an organic material. For example, the bank BNK may be formed as an organic insulating film made of an acrylic resin, an epoxy resin, a phenolic resin, a polyamide resin, a polyimide resin, or the like. However, the material of the bank BNK is not limited to the above-described embodiments.

The emission layer EML may be located in an area corresponding to the opening of the bank BNK. For example, the emission layer EML may be located on one surface of the exposed first electrode AE. The emission layer EML may include at least a light generation layer.

A color of light generated by the light generation layer may be one of red, green, blue, and white, but is not limited thereto. For example, the color of light generated by the light generation layer of the emission layer EML may be one of magenta, cyan, and yellow.

In some embodiments, the emission layer EML may additionally further include a hole injection layer for injecting holes, a hole transport layer for increasing chance of recombination between holes and electrons by having excellent hole transport and blocking movement of electrons that are not be combined in a light generation layer, a hole blocking layer for blocking movement of holes that are not be combined in a light generation layer, an electron transport layer for smoothly transporting electrons to the light generation layer, and an electron injection layer for injecting electrons. The hole injection layer, the hole transport layer, the hole blocking layer, the electron transport layer, and the electron injection layer may be a patterned layer corresponding to the light emitting area or a common film commonly provided to adjacent light emitting areas. The hole injection layer, the hole transport layer, the hole blocking layer, the electron transport layer, and the electron injection layer may be positioned above and/or below the light generation layer.

The second electrode CE may be provided and/or formed on the emission layer EML.

The second electrode CE may be a common film commonly provided in the pixel PXL and the pixel PXL adjacent thereto, but is not limited thereto. The second electrode CE is a transmissive electrode, and may include a transparent conductive material (or substance). The transparent conductive material (or substance) may include a conductive oxide such as an indium tin oxide (ITO), an indium zinc oxide (IZO), a zinc oxide $(ZnO_x)$, an indium gallium zinc oxide (IGZO), and an indium tin zinc oxide (ITZO), and a conductive polymer such as poly(3,4-ethylenedioxythiophene) (PEDOT). Here, the zinc oxide $(ZnO_x)$ may be a zinc oxide (ZnO) and/or a zinc peroxide $(ZnO_2)$.

A thin film encapsulation layer TFE may be provided and/or formed on the second electrode CE.

The thin film encapsulation layer TFE may be formed as a single film, and it may be formed as a multi-film. The thin film encapsulation layer TFE may include a plurality of insulating films covering the light emitting element LD. Specifically, the thin film encapsulation layer TFE may include at least one inorganic film and at least one organic film. For example, the thin film encapsulation layer layer TFE may have a structure in which an inorganic film and an organic film are alternately stacked. In some embodiments, the thin film encapsulation layer TFE may be an encapsulation substrate that is located on the light emitting element LD and bonded to the substrate SUB through a sealant.

In the above-described embodiments, it has been described as an example that the display element layer DPL includes the light emitting element LD configured of a top emission type organic light emitting diode including the first electrode AE, the emission layer EML, and the second electrode CE, but embodiments according to the present disclosure are not limited thereto.

According to some embodiments, as shown in FIG. 5B, the display element layer DPL may include at least one or more of ultra-small inorganic light emitting elements LD (or, light emitting diodes) as small as nano-scale to micro-scale formed in a structure in which a nitride-based semiconductor is grown.

Hereinafter, a pixel PXL illustrated in FIG. 5B will be described in more detail.

Referring to FIG. 1, FIG. 2, FIG. 4, and FIG. 5B, the pixel circuit layer PCL may include a first transistor T1, a bridge pattern BRP, a bottom metal layer BML, and a power line (e.g., a set or predetermined power line).

The first transistor T1 may include an active pattern and a gate electrode GE overlapping a portion of the active pattern. Because the first transistor T1 is the same as or substantially similar to the first transistor T1 described with reference to FIG. 5A, some detailed description thereof may be omitted.

The first transistor T1 may be electrically connected to the bottom metal layer BML through the bridge pattern BRP.

The bridge pattern BRP is a fourth conductive layer CL4 provided and/or formed on the passivation layer PSV, and may be substantially similar to the bridge pattern BRP described with reference to FIG. 5A.

The bottom metal layer BML is a first conductive layer CL1 provided and/or formed on the substrate SUB, and may have a configuration substantially similar to the bottom metal layer BML described with reference to FIG. 5A.

The power line (e.g., the set or predetermined power line) may include, for example, a second power line PL2. The second power line PL2 may be a fourth conductive layer CL4 provided and/or formed on the passivation layer PSV. The second power line PL2 may be provided on the same layer as the bridge pattern BRP. However, the present disclosure is not limited thereto, and the position of the second power line PL2 in the pixel circuit layer PCL may be variously changed. A voltage of the second driving power source VSS described with reference to FIG. 4 may be applied to the second power line PL2. The second power line PL2 may include a conductive material (or substance). For example, the second power line PL2 may be formed to have a single layer (or single film) structure of a single or a mixture thereof selected from a group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double layer (or double film) or multilayer (or multifilm) structure of molybdenum (Mo), titanium (Ti), copper (Cu), aluminum (Al) or silver (Ag), which are a low-resistance material. For example, the second power line PL2 may be formed of a double layer (or double film) stacked in an order of titanium (Ti)/copper (Cu).

Although not directly shown in each of FIG. 5A and FIG. 5B, the pixel circuit layer PCL may further include the first power line PL1 described with reference to FIG. 3 and FIG. 4. In some embodiments, a voltage of the first pixel power source ELVDD described with reference to FIG. 3 or a voltage of the first driving power source VDD described with reference to FIG. 4 may be applied to the first power line PL1.

The display element layer DPL may be provided and/or formed on the pixel circuit layer PCL.

The display element layer DPL may include a bank pattern BNKP, a bank BNK, first and second alignment electrodes ALE1 and ALE2, first and second electrodes AE and CE, first to fourth insulating layers INS1, INS2, INS3, and INS4. Here, the light emitting element LD may have the same configuration as each light emitting element LD described with reference to FIG. 4, and may replace each of a plurality of light emitting elements LD.

The bank pattern BNKP may be provided and/or formed on the via layer VIA, and may be located in a light emitting area in which light is emitted from the pixel PXL. The bank pattern BNKP may support each of the second alignment electrodes ALE1 and ALE2 for changing a surface profile (or shape) of each of the first and second alignment electrodes ALE1 and ALE2 so as to guide the light emitted from the light emitting element LD in an image display direction of the display panel DP (or display device DD). The bank pattern BNKP may include an inorganic insulating film including an inorganic material or an organic insulating film including an organic material. In some embodiments, the bank pattern BNKP may include an organic insulating film of a single film and/or an inorganic insulating film of a single layer, but is not limited thereto. In some embodiments, the bank pattern BNKP may be provided in a multi-layered structure in which at least one or more of organic insulating film and at least one or more of inorganic insulating film are stacked. However, the material of the bank pattern BNKP is not limited to the above-described example, and in some embodiments, the bank pattern BNKP may include a conductive material.

The bank BNK may surround at least one side of a peripheral area (for example, a non-light emitting area in which light is not emitted) of the pixel PXL. The bank BNK may be a pixel defining film or a dam structure defining a light emitting area in which the light emitting element LD is to be supplied in a process of supplying the light emitting element LD to the pixel PXL. For example, as the light emitting area of the pixel PXL is partitioned by the bank BNK, a mixed solution (for example, ink) including a target amount and/or type of light emitting element LD may be supplied to (or injected into) the light emitting area. The bank BNK may be configured to include at least one light blocking material and/or a reflective material to prevent or reduce instances of light leakage occurring between the pixel PXL and pixels PXL adjacent thereto. In some embodiments, the bank BNK may include a transparent material (or substance). The transparent material may include, for example, a polyamides resin, a polyimide resin, and the like, but is not limited thereto. According to some embodiments, a reflective material layer may be separately provided and/or formed on the bank BNK to further improve an efficiency of light emitted from the pixel PXL.

According to some embodiments, the bank BNK may have the same configuration as the bank BNK described with reference to FIG. 5A.

Each of the first and second alignment electrodes ALE1 and ALE2 may be provided and/or formed on the bank pattern BNKP to have a surface profile corresponding to a shape of the bank pattern BNKP. Each of the first and second alignment electrodes ALE1 and ALE2 may be made of a material having a constant reflectance so as to guide the light emitted from the light emitting element LD in the image display direction of the display panel DP (or display device DD).

For example, each of the first alignment electrode AEL1 and the second alignment electrode ALE2 may be made of a conductive material (or substance) having a constant reflectance. The conductive material (or substance) may include an opaque metal that is configure to reflect light emitted by the light emitting elements LD in the image display direction of the first display panel DP (or display device DD). The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. In some embodiments, each of the first alignment electrode AEL1 and the second alignment electrode ALE2 may include a transparent conductive material (or substance). When the first alignment electrode AEL1 and the second alignment electrode AEL2 contain a transparent conductive material (or substance), a separate conductive layer of made of an opaque metal for reflecting the light emitted from the light emitting element LD in the image display direction of the first display panel DP (or display device DD) may be added. However, the materials of the first alignment electrode AEL1 and the second alignment electrode AEL2 are not limited to the above materials.

The first alignment electrode ALE1 may be electrically connected to the driving transistor T through the first contact portion CNT1 passing through the via layer VIA and the passivation layer PSV and the second connecting member TE2, and the second alignment electrode ALE2 may be electrically connected to the second power line PL2 through the second contact portion CNT2 passing through the via layer VIA.

The light emitting element LD may be arranged between the first alignment electrode ALE1 and the second alignment electrode ALE2, and may be electrically connected to the first and second alignment electrodes EL1 and ALE2, respectively. The light emitting element LD may emit one of color light and/or white light. The light emitting element LD may be provided in a form sprayed into a mixed solution to be injected into the pixel PXL. The light emitting element LD may include a light emitting stacking pattern in which a first semiconductor layer 11, an active layer 12, and a second semiconductor layer 13 are sequentially stacked along one direction. In addition, the light emitting element LD may include an insulating film surrounding an external circumferential surface of the light emitting stacked pattern.

According to some embodiments, the first semiconductor layer 11 may include at least one N-type semiconductor layer. For example, the first semiconductor layer 11 may include a semiconductor material of one of InAlGaN, GaN, AlGaN, InGaN, AlN, and InN, and may be a n-type semiconductor layer doped with a first conductive dopant (or n-type dopant) such as Si, Ge, Sn, or the like. The active layer 12 is located on the first semiconductor layer 11, and may be formed to have a single or multi-quantum well (MQW) structure. The second semiconductor layer 13 is located on the active layer 12, and may include a semiconductor layer of a type different from that of the first semiconductor layer 11. For example, the second semiconductor layer 13 may include at least one P-type semiconductor layer. For example, the second semiconductor layer 13 may include at least one semiconductor material of InAlGaN, GaN, AlGaN, InGaN, AlN, and InN, and may include a p-type semiconductor layer doped with a second conductive dopant (or p-type dopant) such as Mg.

The light emitting elements LD may be mixed with a volatile solvent and then injected (or supplied) into the pixel area PXA through an inkjet printing method or a slit coating method. In this case, when an alignment signal corresponding to each of the first alignment electrode ALE1 and the second alignment electrode ALE2 is applied, an electric field may be formed between the first alignment electrode ALE1 and the second alignment electrode ALE2. Accordingly, the light emitting elements LD may be aligned between the first alignment electrode AEL1 and the second alignment electrode ALE2.

The light emitting element LD may be provided and/or formed on the first insulating layer INS1.

The first insulating layer INS1 may be provided and/or formed between each of the first and second alignment electrodes ALE1 and ALE2 and the via layer VIA. The first insulating layer INS1 may stably support the light emitting element LD by filling a space between the light emitting element LD and the via layer VIA. The first insulating layer INS1 may include an inorganic insulating film made of an inorganic material or an organic insulating film made of an organic material. The first insulating layer INS1 may be partially opened to expose a portion of the first alignment electrode ALE1 and a portion of the second alignment electrode ALE2, respectively.

The second insulating layer INS2 may be provided and/or formed on the light emitting element LD. The second insulating layer INS2 may be provided and/or formed on the light emitting element LD to cover a portion of an upper surface of the light emitting element LD, and may exposes respective end portions of the light emitting element LD to the outside. The second insulating layer INS2 may further fix the light emitting element LD.

The first electrode AE and the second electrode CE may be arranged to be spaced apart from each other on the second insulating layer INS2 on the light emitting element LD.

The first electrode AE may be formed on the first alignment electrode ALE1 and one end of the light emitting element LD to be electrically connected to one end of the light emitting element LD. The first electrode AE may directly contact the first alignment electrode ALE1 exposed by removing a portion of the first insulating layer INS1 to be electrically and/or physically connected to the first alignment electrode ALE1. According to some embodiments, the first electrode AE may be an anode.

The second electrode CE may be formed on the second alignment electrode ALE2 and the other end of the light emitting element LD to be electrically connected to the other end of the light emitting element LD. The second electrode CE may directly contact the second alignment electrode ALE2 exposed by removing another portion of the first insulating layer INS1 to be electrically and/or physically connected to the second alignment electrode ALE2. According to some embodiments, the second electrode CE may be a cathode.

The first electrode AE and the second electrode CE may be made of various transparent conductive materials to allow the light emitted from the light emitting element LD to be directed in the image display direction of the display device DD without loss.

According to some embodiments, the first electrode AE and the second electrode CE may be provided in different layers. In this case, the third insulating layer INS3 may be provided and/or formed between the first electrode AE and the second electrode CE. The third insulating layer INS3 may be located on the first electrode AE to cover the first electrode AE (or prevent or reduce the first electrode AE being exposed to the outside) to prevent or reduce corrosion of the first electrode AE. The third insulating layer INS3 may include an inorganic insulating film made of an inorganic material or an organic insulating film made of an organic material.

The fourth insulating layer INS4 may be provided and/or formed on the first electrode AE and the second electrode CE. The fourth insulating layer INS4 may be an inorganic film (or an inorganic insulating film) including an inorganic material or an organic film (or an organic insulating film) including an organic material. For example, the fourth insulating layer INS4 may have a structure in which at least one inorganic film and at least one organic film are alternately stacked. The fourth insulating layer INS4 may entirely cover the display element layer DPL to block moisture or moisture from the outside from being introduced into the display element layer DPL including the light emitting elements LD.

Figure 6:
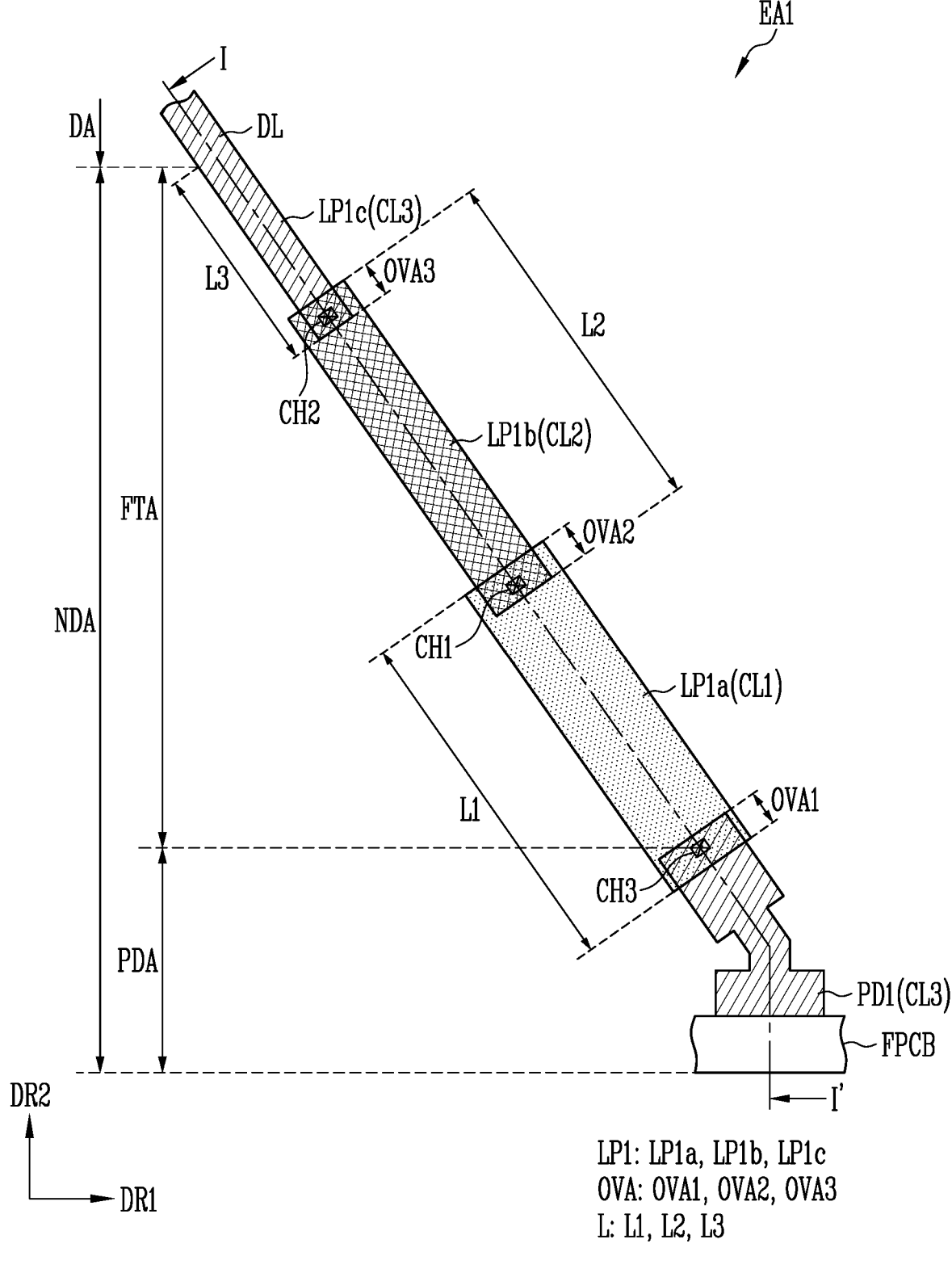
FIG. 6 illustrates a schematic enlarged top plan view of an area EA1 of FIG. 2 according to some embodiments.
Figure 7:
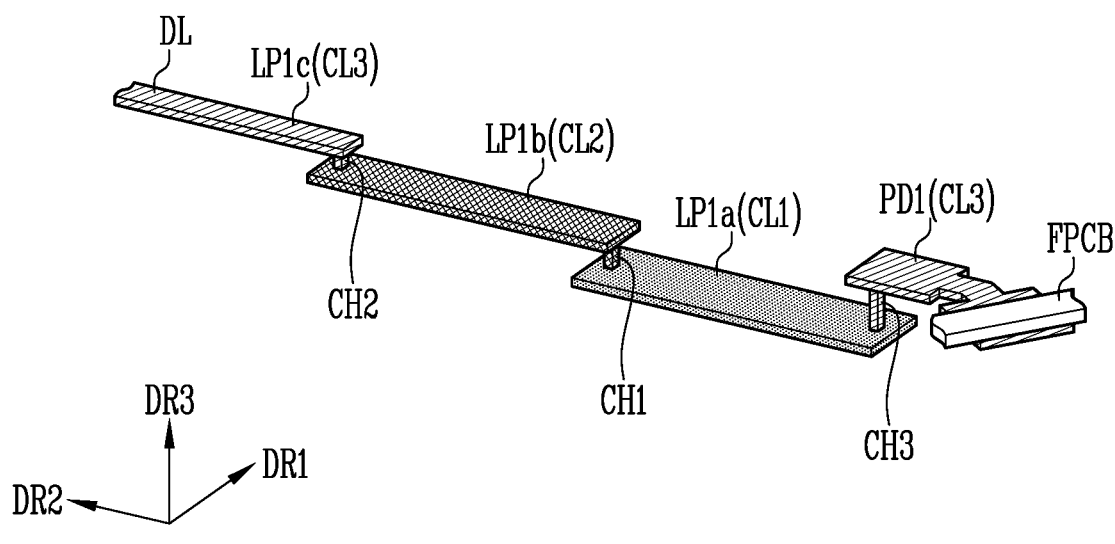
FIG. 7 illustrates a schematic perspective view of constituent elements included in an area EA1 of FIG. 6.
Figure 8:
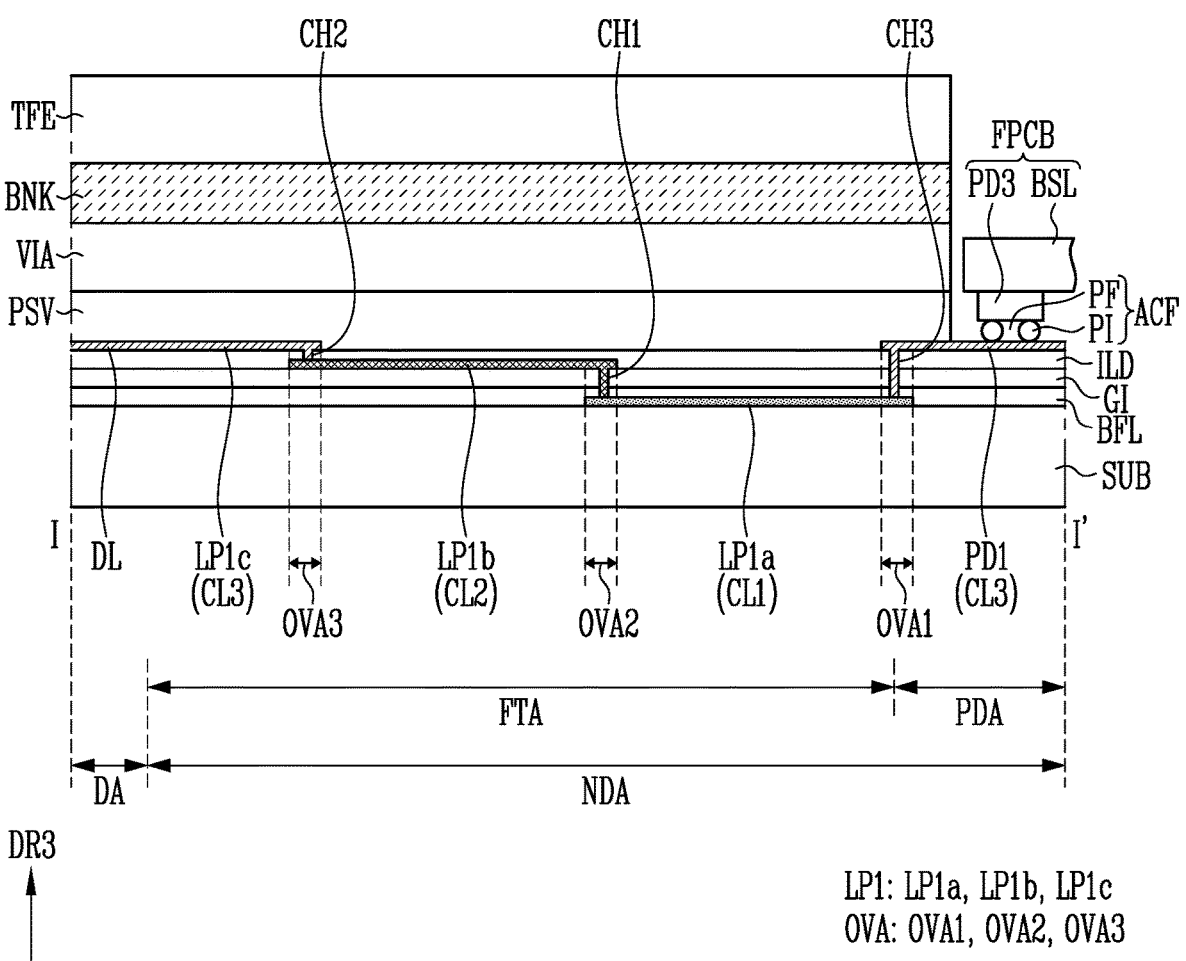
FIG. 8 and FIG. 9 illustrate cross-sectional views taken along the line I-I' of FIG. 6.
Figure 9:
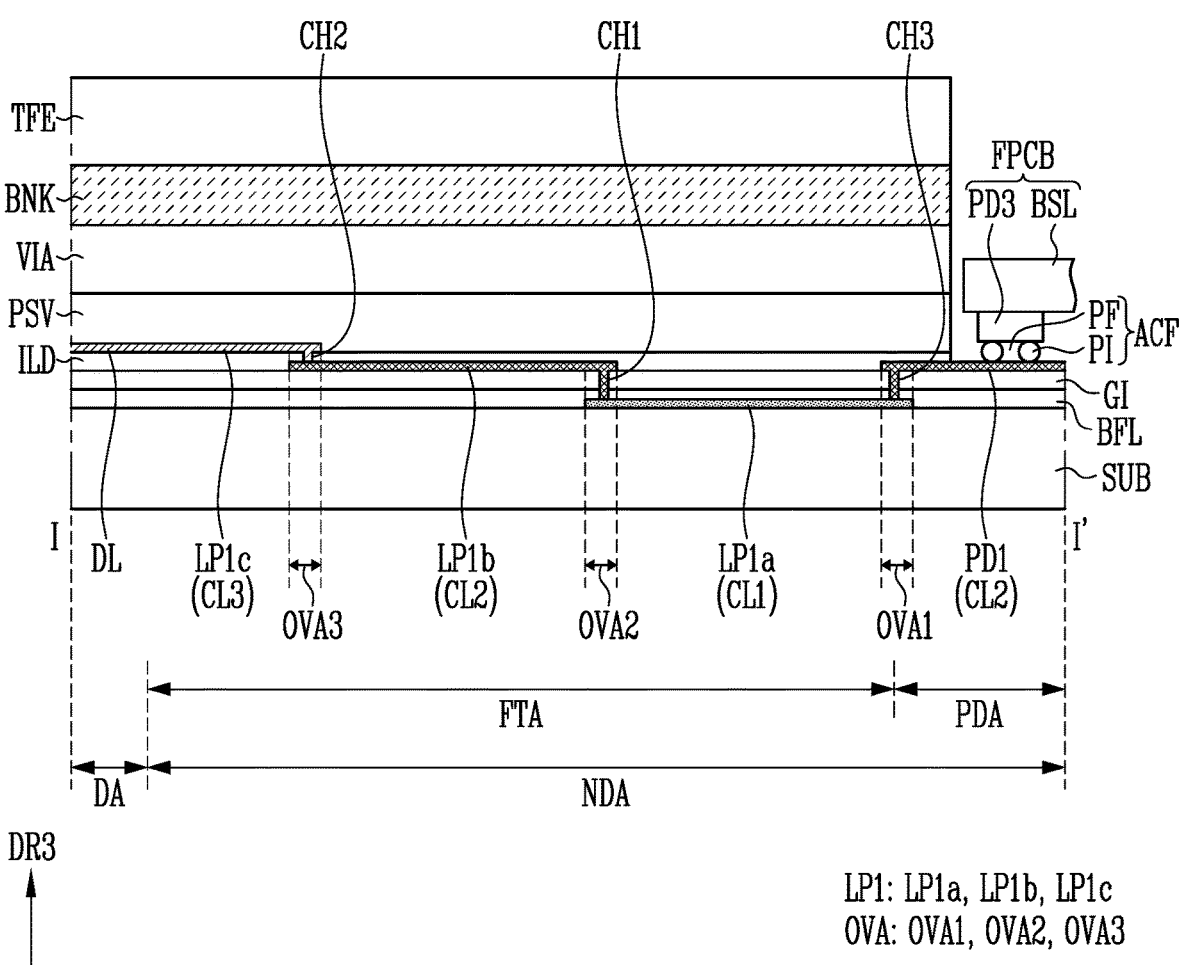
Figure 10:
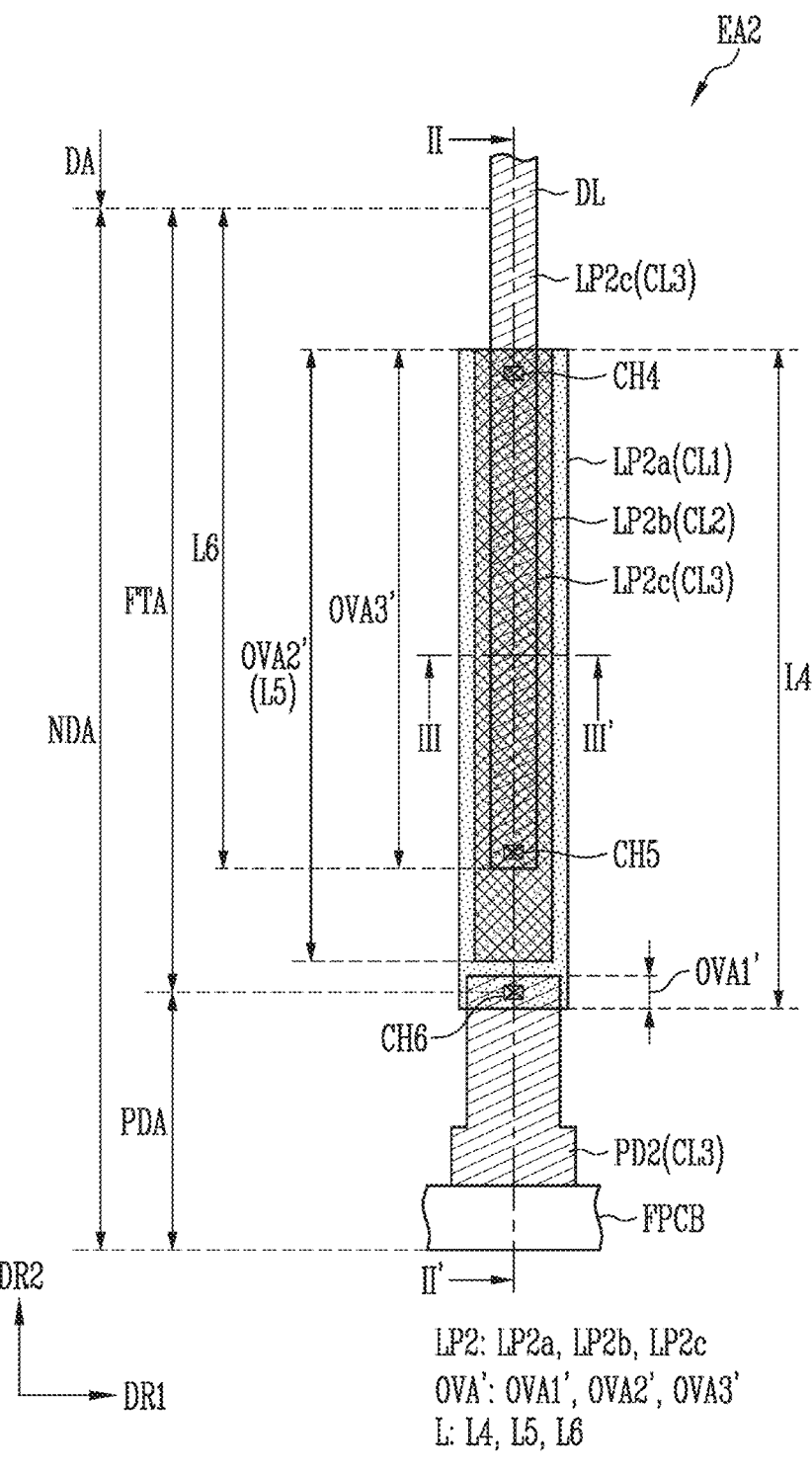
FIG. 10 illustrates a schematic enlarged top plan view of an area EA2 of FIG. 2.
Figure 11:
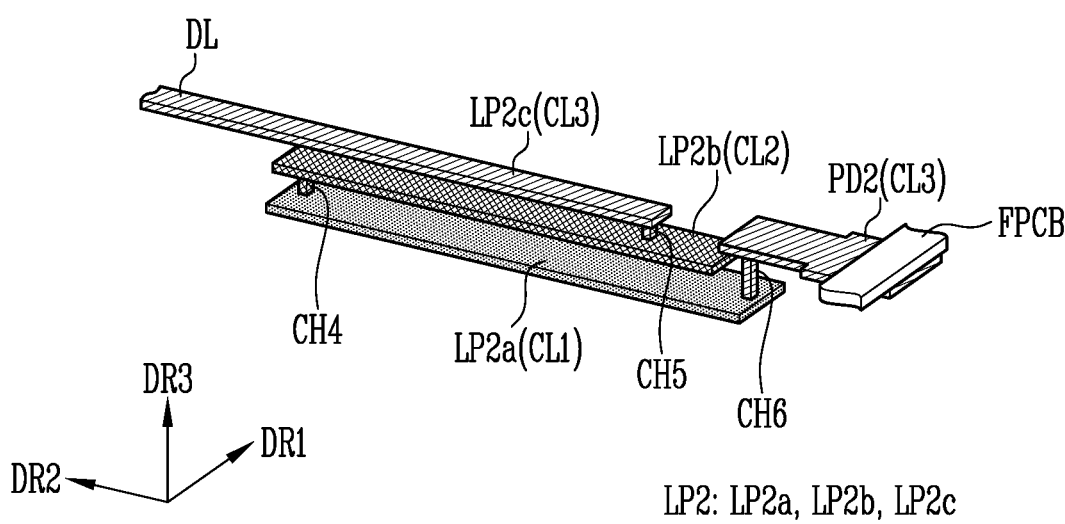
FIG. 11 illustrates a schematic perspective view of constituent elements included in an area EA2 of FIG. 10.
Figure 12:
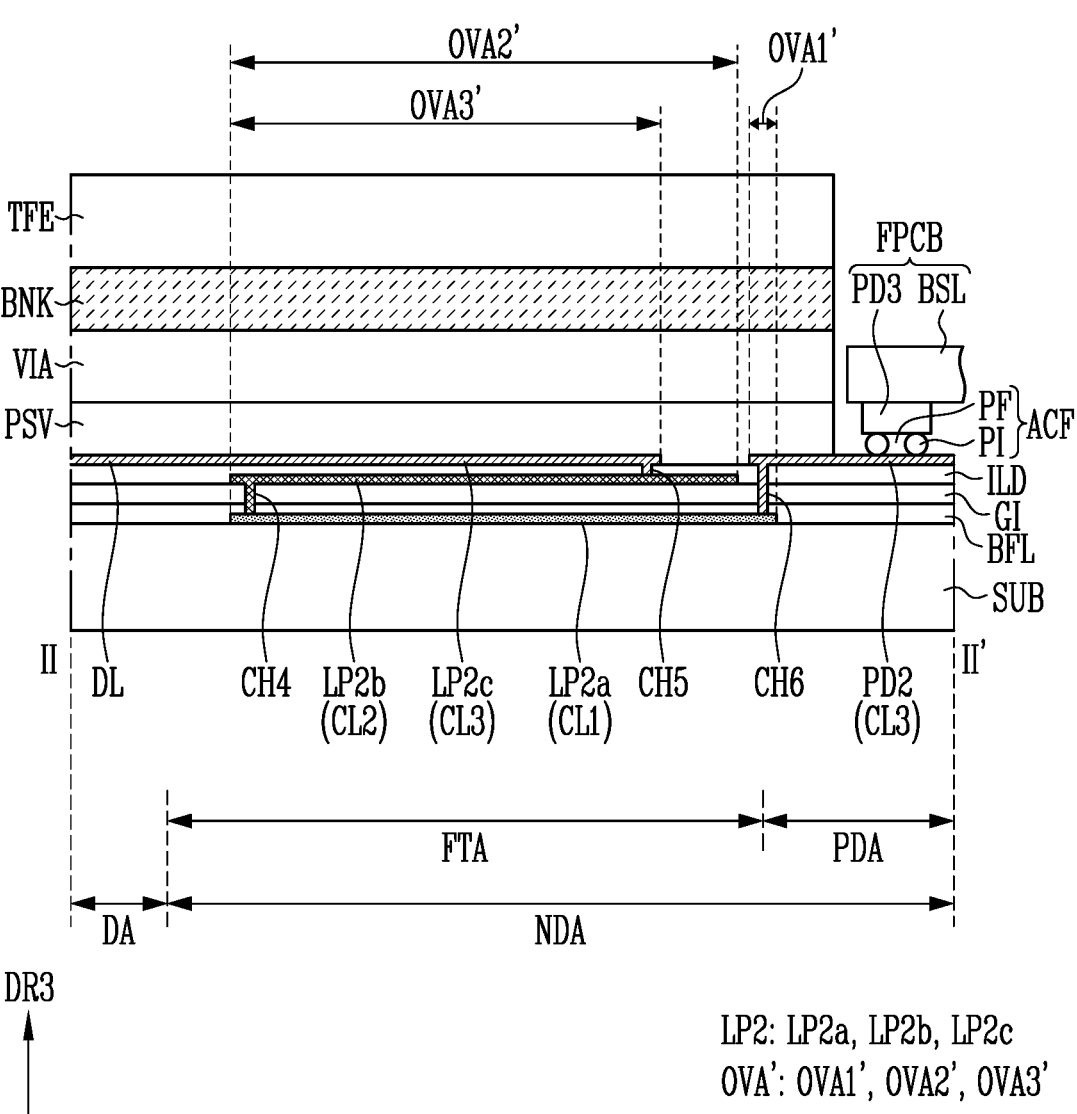
FIG. 12 and FIG. 13 illustrate cross-sectional views taken along the line II-II' of FIG. 10.
Figure 13:
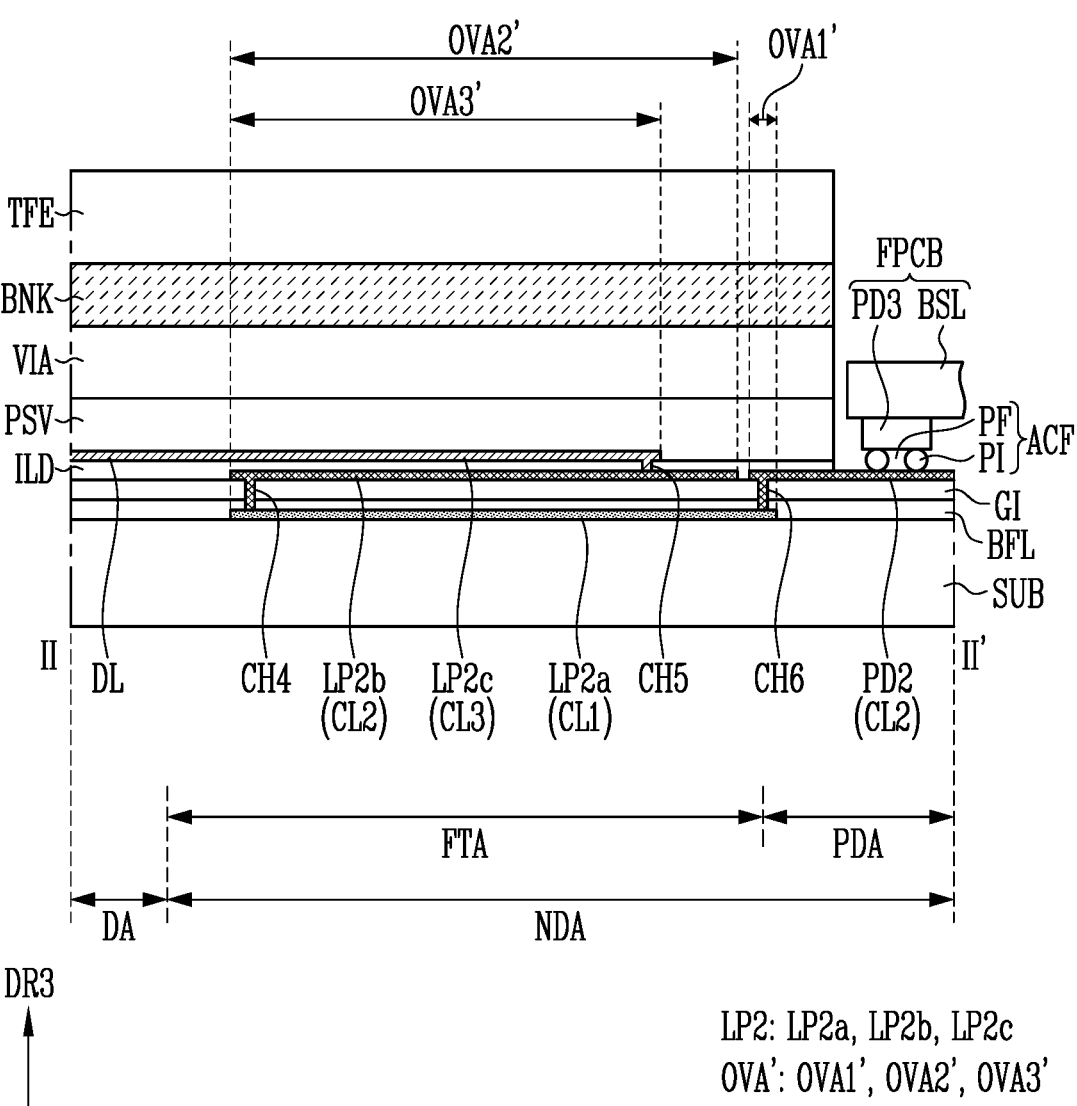
Figure 14:
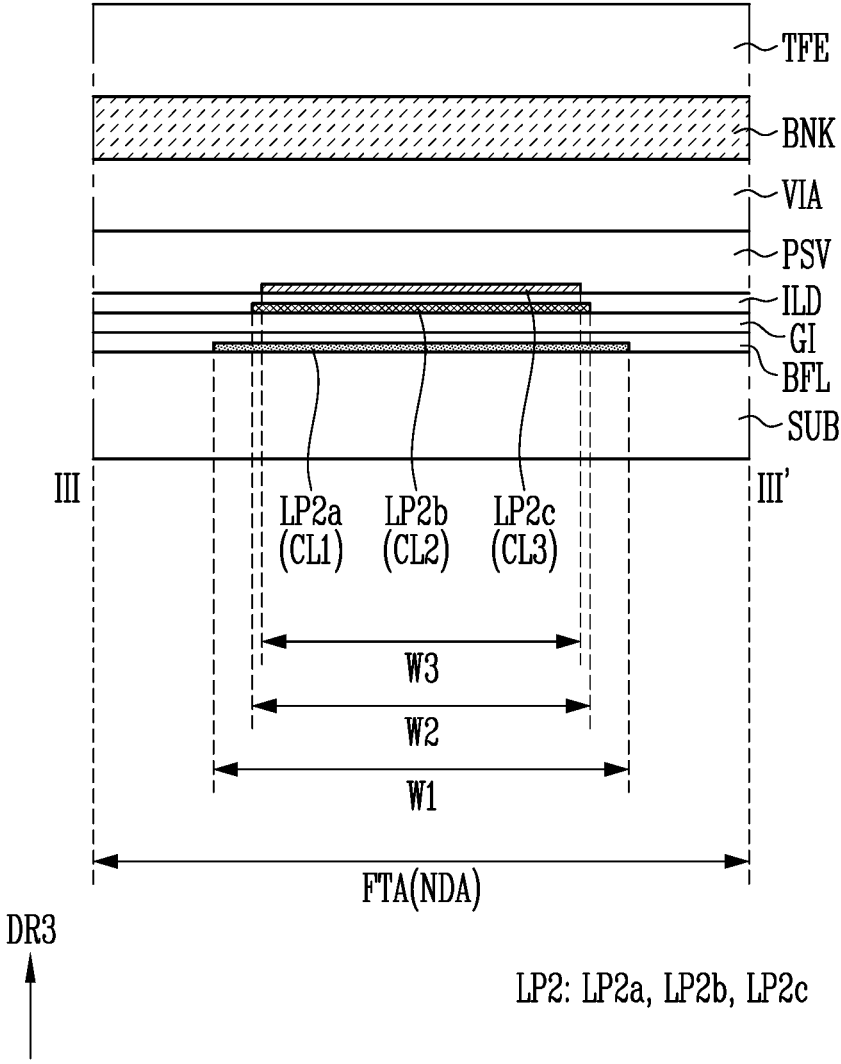
FIG. 14 illustrates a cross-sectional view taken along the line III-III' of FIG. 10.

FIG. 6 illustrates a schematic enlarged top plan view of an area EA1 of FIG. 2, FIG. 7 illustrates a schematic perspective view of constituent elements included in an area EA1 of FIG. 6, FIG. 8 and FIG. 9 illustrate cross-sectional views taken along line I-I' of FIG. 6, FIG. 10 illustrates a schematic enlarged top plan view of an area EA2 of FIG. 2, FIG. 11 illustrates a schematic perspective view of constituent elements included in an area EA2 of FIG. 10, FIG. 12 and FIG. 13 illustrate cross-sectional views taken along line II-II' of FIG. 10, and FIG. 14 illustrates a cross-sectional view taken along line III-III' of FIG. 10.

FIG. 8 and FIG. 9 illustrate different embodiments with respect to a position of the first pad PD1. For example, FIG. 8 illustrates embodiments in which the first pad PD1 is the third conductive layer CL3 positioned on the interlayer insulating layer ILD, and FIG. 9 illustrates embodiments in which the first pad PD1 is the second conductive layer CL2 positioned on the gate insulating layer GI.

FIG. 12 and FIG. 13 illustrate different embodiments with respect to a position of the second pad PD2. For example, FIG. 12 illustrates embodiments in which the second pad PD2 is the third conductive layer CL3 positioned on the interlayer insulating layer ILD, and FIG. 13 illustrates embodiments in which the second pad PD2 is the second conductive layer CL2 positioned on the gate insulating layer GI.

In describing the embodiments, "formed and/or provided in the same layer" may mean that it is formed in the same process, and "formed and/or provided in a different layer" may mean that it is formed in different processes.

FIG. 8, FIG. 9, and FIG. 12 to FIG. 14 simplify and illustrate some constituent elements located in the non-display area NDA, such as illustrating each electrode as only a single-layered (or single-filmed) electrode and each insulating layer as only a single-layered (or single-filmed) insulating layer, but the present disclosure is not limited thereto.

In addition, in FIG. 6 to FIG. 14, for better understanding and ease of description, a horizontal direction in a plan view is indicated by the first direction DR1, a vertical direction in a plan view is indicated by the second direction DR2, and a thickness direction of the substrate SUB in a plan view is indicated by the third direction DR3. The first, second, and third directions DR1, DR2, and DR3 may mean directions indicated by the first, second, and third directions DR1, DR2, and DR3, respectively.

Referring to FIG. 1 to FIG. 14, the fan-out lines LP and the pad part PDP may be positioned in the non-display area NDA of the display panel DP (or the display device DD).

The fan-out lines LP may be positioned in the fan-out area FTA, and the pads PD included in the pad part PDP may be positioned in the pad area PDA.

Each of the fan-out lines LP may have a multi-layered stacking structure in which a first sub-line, a second sub-line, and a third sub-lines positioned on different layers are sequentially stacked. For example, the first fan-out line LP1 may have a multi-layered stacking structure in which a (1-1)-th sub-line LP1a, a (1-2)-th sub-line LP1b, and a (1-3)-th sub-line LP1c are stacked. In addition, the second fan-out line LP2 may have a multi-layered stacking structure in which a (2-1)-th sub-line LP2a, a (2-2)-th sub-line LP2b, and a (2-3)-th sub-line LP2c are stacked.

Hereinafter, for convenience, referring to FIG. 6 to FIG. 9, the first fan-out line LP1 will be first described, and then, the second fan-out line LP2 will be described with reference to FIG. 10 to FIG. 14.

Referring to FIG. 6 to FIG. 9, the first fan-out line LP1 may include the (1-1)-th sub-line LP1a, the (1-2)-th sub-line LP1b, and the (1-3)-th sub-line LP1c.

The (1-1)-th sub-line LP1a may be the first conductive layer CL1 positioned between the substrate SUB and the buffer layer BFL, and the (1-2)-th sub-line LP1b may be the second conductive layer CL2 positioned on the gate insulating layer GI, and the (1-3)-th sub-line LP1c may be the third conductive layer CL3 positioned on the interlayer insulating layer ILD.

The (1-1)-th sub-line LP1a is provided and/or formed on the same layer as the bottom metal layer BML positioned in the pixel area PXA, and may include the same material as the bottom metal layer BML. The (1-1)-th sub-line LP1a and the bottom metal layer BML may be formed by the same process.

The (1-2)-th sub-line LP1b is provided and/or formed on the same layer as the gate electrode GE positioned in the pixel area PXA, and may include the same material as the gate electrode GE. The (1-2)-th sub-line LP1b and the gate electrode GE may be formed by the same process.

The (1-3)-th sub-line LP1c is provided and/or formed on the same layer as the first and second connecting members TE1 and TE2 positioned in the pixel area PXA, and may include the same material as the first and second connecting members TE1 and TE2. The (1-3)-th sub-line LP1c and the first and second connecting members TE1 and TE2 may be formed by the same process.

The first fan-out line LP1 including the (1-1)-th, (1-2)-th, and (1-3)-th sub-lines LP1a, LP1b, and LP1c may be electrically and/or physically connected to the first pad PD1. In addition, the first fan-out line LP1 including the (1-1)-th, (1-2)-th, and (1-3)-th sub-lines LP1a, LP1b, and LP1c may be electrically and/or physically connected to the data line DL of the corresponding pixel PXL positioned in the display area DA.

The first pad PD1 may be electrically and/or physically connected to the (1-1)-th sub-line LP1a. As shown in FIG. 8, the first pad PD1 may be the third conductive layer CL3 located on an interlayer insulating layer ILD. In this case, the first pad PD1 is provided and/or formed on the same layer as the (1-3)-th sub-line LP1c, and may include the same material as the (1-3)-th sub-line LP1c. As shown in FIG. 8, the first pad PD1 located on the interlayer insulating layer ILD may be electrically connected to the circuit board FPCB. At least a portion of the first pad PD1 may be exposed without being covered by the passivation layer PSV, the via layer VIA, the bank BNK, and the thin film encapsulation layer TFE. The exposed first pad PD1 may be electrically connected to the circuit board FPCB by a conductive adhesive member ACF.

The circuit board FPCB may include a third pad PD3 electrically connected to the pads PD of the pad part PDP. For example, the circuit board FPCB may include at least one third pad PD3 electrically connected to the first pad PD1. The third pad PD3 may be positioned on the base layer BSL of the circuit board FPCB.

The conductive adhesive member ACF may include conductive particles PI formed in an adhesive film PF having adhesive properties. The conductive particles PI may electrically connect the first pad PD1 of the pad part PDP and the third pad PD3 of the circuit board FPCB. Accordingly, a signal (for example, a data signal) transmitted from the driver DIC mounted on the circuit board FPCB to the third pad PD3 may be transmitted to the first pad PD1 of the pad part PDP through the conductive adhesive member ACF to be transmitted to the data line DL of the pixels PXL corresponding to the first fan-out line LP1.

In some embodiments, the first pad PD1 may be the second conductive layer CL2 located on the gate insulating layer GI as shown in FIG. 9. In this case, the first pad PD1 is provided and/or formed on the same layer as the (1-2)-th sub-line LP1b, and may include the same material as the (1-2)-th sub-line LP1b. As shown in FIG. 9, the first pad PD1 located on the gate insulating layer GI may be electrically connected to the circuit board FPCB. At least a portion of the first pad PD1 may be exposed without being covered by the interlayer insulating layer ILD, the passivation layer PSV, the via layer VIA, the bank BNK, and the thin film encapsulation layer TFE. The exposed first pad PD1 may be electrically connected to a corresponding third pad PD3 of the circuit board FPCB by the conductive adhesive member ACF.

According to some embodiments, one end of the (1-1)-th sub-line LP1a may be electrically and/or physically connected to the first pad PD1 through a third contact hole CH3. For example, as shown in FIG. 8, one end of the (1-1)-th sub-line LP1a may be electrically and/or physically connected to the first pad PD1 through the third contact hole CH3 that sequentially passes through the buffer layer BFL, the gate insulating layer GI, and the interlayer insulating layer ILD. In some embodiments, as shown in FIG. 9, when the first pad PD1 is the second conductive layer CL2, one end of the (1-1)-th sub-line LP1a may be electrically and/or physically connected to the first pad PD1 through the third contact hole CH3 sequentially penetrating the buffer layer BFL and the gate insulating layer GI.

The other end of the (1-1)-th sub-line LP1a may be electrically and/or physically connected to the (1-2)-th sub-line LP1b through a first contact hole CH1. For example, as shown in FIG. 8 and FIG. 9, the other end of the (1-1)-th sub-line LP1a may be electrically and/or physically connected to the (1-2)-th sub-line LP1b through the first contact hole CH1 sequentially penetrating the gate insulating layer GI and the buffer layer BFL.

One end of the (1-2)-th sub-line LP1b may be electrically and/or physically connected to the (1-1)-th sub-line LP1a through the first contact hole CH1.

The other end of the (1-2)-th sub-line LP1b may be electrically and/or physically connected to the (1-3)-th sub-line LP1c through a second contact hole CH2. For example, as shown in FIG. 8 and FIG. 9, the other end of the (1-2)-th sub-line LP1b may be electrically and/or physically connected to the (1-3)-th sub-line LP1c through the second contact hole CH2 penetrating the interlayer insulating layer ILD.

According to some embodiments, one end of the (1-3)-th sub-line LP1c may be electrically and/or physically connected to the (1-2)-th sub-line LP1b through the second contact hole CH2. The other end of the (1-3)-th sub-line LP1c may be electrically and/or physically connected to the data line DL of the corresponding pixel PXL. The data line DL may be the third conductive layer CL3 provided and/or formed on the interlayer insulating layer ILD. In this case, the (1-3)-th sub-line LP1c may be integrally formed with the data line DL, and may be regarded as an area of the data line DL.

Each of the (1-1)-th, (1-2)-th, and (1-3)-th sub-lines LP1a, LP1b, an LP1c may extend in an oblique direction inclined to the first direction DR1 (or second direction DR2) when viewed in a plan view. Accordingly, each of the (1-1)-th, (1-2)-th, and (1-3)-th sub-lines LP1a, LP1b, an LP1c may configure an oblique portion of the first fan-out line LP1.

According to some embodiments, the (1-2)-th sub-line LP1b may directly contact the (1-1)-th sub-line LP1a through the first contact hole CH1 to be electrically connected to the (1-1)-th sub-line LP1a. The (1-3)-th sub-line LP1c may directly contact the (1-2)-th sub-line LP1b through the second contact hole CH2 to be electrically connected to the (1-2)-th sub-line LP1b. In addition, as shown in FIG. 8 and FIG. 9, the first pad PD1 directly contacts the (1-1)-th sub-line LP1$a$ through the third contact hole CH3 to be electrically connected to the (1-1)-th sub-line LP1$a$.

When a signal (e.g., a set or predetermined signal) (for example, a data signal) is applied from the driver DIC to the first pad PD1, the signal may be transmitted to the data line DL of the corresponding pixel PXL through the first pad PD1, the (1-1)-th sub line LP1$a$, the (1-2)-th sub-line LP1$b$, and the (1-3)-th sub-line LP1$c$.

In the first fan-out line LP1, a length L1 in an extension direction of the (1-1)-th sub-line LP (hereinafter referred to as a "first length L1"), a length L2 in an extension direction of the (1-2)-th sub-line LP1$b$ (hereinafter, referred to as a "second length L2"), and a length L3 in an extension direction of the (1-3)-th sub-line LP1$c$ (hereinafter, referred to as a "third length L3") may be different from each other, but the present disclosure is not limited thereto. In some embodiments, in the first fan-out line LP1, the first length L1 of the (1-1)-th sub-line LP1$a$, the second length L2 of the (1-2)-th sub-line LP1$b$, and the third length L3 of the (1-3)-th sub-lines LP1$c$ may be equal to each other. In addition, according to some embodiments, in the first fan-out line LP1, at least two sub-lines of the first length L1 of the (1-1)-th sub-line LP1$a$, the second length L2 of the (1-2)-th sub-line LP1$b$, and the third length L3 of the (1-3)-th sub-lines LP1$c$ may be the same, and the other sub-line thereof may be different from the two sub-lines thereof, but the present disclosure is not limited thereto.

A width of the (1-1)-th sub-line LP1$a$ (for example, a width in a direction crossing the extension direction of the (1-1)-th sub-line LP1$a$), a width of the (1-2)-th sub-line LP1$b$ (for example, a width in a direction crossing the extension direction of the (1-2)-th sub-line LP1$b$), and a width of the (1-3)-th sub-lines LP1$c$ (for example, a width in a direction crossing the extension direction of the (1-3)-th sub-lines LP1$c$) may be different from each other, but are not limited thereto. In some embodiments, the width of the (1-1)-th sub-line LP1$a$, the width of the (1-2)-th sub-line LP1$b$, and the width of the (1-3)-th sub-line LP1$c$ may be the same as each other.

According to some embodiments, the width and/or the first length L1 of the (1-1)-th sub-line LP1$a$, the width and/or the second length L2 of the (1-2)-th sub-line LP1$b$, and the width and/or the third length L3 of the (1-3)-th sub-line LP1$c$ may be variously changed, within a range in which the fan-out lines LP positioned in the fan-out area FTA have the same wire length L and the same wire resistance. The wire length L of the first fan-out line LP1 by adding all of the first length L1 of the (1-1)-th sub-line LP1$a$, the second length L2 of the (1-2)-th sub-line LP1$b$, and the third length L3 of the (1-3)-th sub-lines LP1$c$ may be the same as or substantially similar to the wire length L of the second fan-out line LP2. In addition, the wire resistance of the first fan-out line LP1 may be the same as the wire resistance of the second fan-out line LP2.

The first, second, and third contact holes CH1, CH2, and CH3 may be positioned so as not to correspond to each other in the fan-out area FTA. For example, the first contact hole CH1 may be positioned so as not to correspond to the second and third contact holes CH2 and CH3 in the fan-out area FTA, the second contact hole CH2 may be positioned so as not to correspond to the first and third contact holes CH1 and CH3 in the fan-out area FTA, and the third contact hole CH3 may be positioned so as not to correspond to the first and second contact holes CH1 and CH2 in the fan-out area FTA.

Each of the positions of the first, second, and third contact holes CH1, CH2, and CH3 in the non-display area NDA may correspond to an area OVA in which two of the (1-1)-th, (1-2)-th, and (1-3)-th sub-lines LP1$a$, LP1$b$, and LP1$c$ and the first pad PD1 that directly contact and are electrically connected to each other overlap each other.

In the non-display area NDA, the third contact hole CH3 may be positioned to correspond to an overlapping area OVA1 (hereinafter referred to as a "(1-1)-th overlapping area") in which one end of the (1-1)-th sub-line LP1$a$ and the first pad PD1 overlap each other. In addition, in the non-display area NDA, the first contact hole CH1 may be positioned to correspond to an overlapping area OVA2 (hereinafter referred to as a "(2-1)-th overlapping area") in which the other end of the (1-1)-th sub-line LP1$a$ and one end of the (1-2)-th sub-line LP2$b$ overlap each other. Additionally, in the non-display area NDA, the second contact hole CH2 may be positioned to correspond to an overlapping area OVA3 (hereinafter referred to as a "(3-1)-th overlapping area") in which the other end of the (1-2)-th sub-line LP1$b$ and one end of the (1-3)-th sub-line LP1$c$ overlap each other.

A size of the (1-1)-th overlapping area OVA1, a size of the (2-1)-th overlapping area OVA2, and a size of the (3-1)-th overlapping area OVA3 may be different from each other, but are not limited thereto.

Hereinafter, (2-1)-th, (2-2)-th, and (2-3)-th sub-lines LP2$a$, LP2$b$, and LP2$c$ included in the second fan-out line LP2 will be described with reference to FIG. 10 to FIG. 14.

Referring to FIG. 2 and FIG. 10 to FIG. 14, the second fan-out line LP2 may include the (2-1)-th sub-line LP2$a$, the (2-2)-th sub-line LP2$b$, and the (2-3)-th sub-line LP2$c$.

The (2-1)-th sub-line LP2$a$ may be the first conductive layer CL1 positioned between the substrate SUB and the buffer layer BFL, and the (2-2)-th sub-line LP2$b$ may be the second conductive layer CL2 positioned on the gate insulating layer GI, and the (2-3)-th sub-line LP2$c$ may be the third conductive layer CL3 positioned on the interlayer insulating layer ILD.

The (2-1)-th sub-line LP2$a$ is provided and/or formed on the same layer as the bottom metal layer BML and the (1-1)-th sub-line LP1$a$ positioned in the pixel area PXA, and may include the same material as the bottom metal layer BML and the (1-1)-th sub-line LP1$a$. The (2-1)-th sub-line LP2$a$, the bottom metal layer BML, and the (1-1)-th sub-line LP1$a$ may be formed by the same process.

The (2-2)-th sub-line LP2$b$ is provided and/or formed on the same layer as the gate electrode GE and the (1-2)-th sub-line LP1$b$ positioned in the pixel area PXA, and may include the same material as the gate electrode GE and the (1-2)-th sub-line LP1$b$. The (2-2)-th sub-line LP2$b$, the gate electrode GE, and the (1-2)-th sub-line LP1$b$ may be formed by the same process.

The (2-3)-th sub-line LP2$c$ is provided and/or formed on the same layer as the first and second connecting members TE1 and TE2 and the (1-3)-th sub-line LP1$c$ positioned in the pixel area PXA, and may include the same material as the first and second connecting members TE1 and TE2 and the (1-3)-th sub-line LP1$c$.

The second fan-out line LP2 including the (2-1)-th, (2-2)-th, and (2-3)-th sub-lines LP2$a$, LP2$b$, and LP2$c$ may be electrically and/or physically connected to the second pad PD2. In addition, the second fan-out line LP2 including the (2-1)-th, (2-2)-th, and (2-3)-th sub-lines LP2$a$, LP2$b$, and LP2$c$ may be electrically and/or physically connected to the data line DL of the corresponding pixel PXL positioned in the display area DA.

The second pad PD2 may be electrically and/or physically connected to the (2-1)-th sub-line LP2*a*. As shown in FIG. 12, the second pad PD2 may be the third conductive layer CL3 located on an interlayer insulating layer ILD. In this case, the second pad PD2 is provided and/or formed on the same layer as the (2-3)-th sub-line LP2*c*, and may include the same material as the (2-3)-th sub-line LP2*c*. As shown in FIG. 12, the second pad PD2 located on the interlayer insulating layer ILD may be electrically connected to the circuit board FPCB. At least a portion of the second pad PD2 may be exposed without being covered by the passivation layer PSV, the via layer VIA, the bank BNK, and the thin film encapsulation layer TFE. The exposed second pad PD2 may be electrically connected to the circuit board FPCB by a conductive adhesive member ACF. The conductive adhesive member ACF may be the conductive adhesive member ACF described with reference to FIG. 8.

The circuit board FPCB may include at least one third pad PD3 electrically connected to the second pad PD2. The third pad PD3 may be positioned on the base layer BSL of the circuit board FPCB. A signal (for example, a data signal) transmitted from the driver DIC mounted on the circuit board FPCB to the third pad PD3 may be transmitted to the second pad PD2 of the pad part PDP through the conductive adhesive member ACF to be transmitted to the data line DL of the pixels PXL corresponding to the second fan-out line LP2.

In some embodiments, the second pad PD2 may be the second conductive layer CL2 located on the gate insulating layer GI as shown in FIG. 13. In this case, the second pad PD2 is provided and/or formed on the same layer as the (2-2)-th sub-line LP2*b*, and may include the same material as the (2-2)-th sub-line LP2*b*. As shown in FIG. 13, the second pad PD2 located on the gate insulating layer GI may be electrically connected to the circuit board FPCB. At least a portion of the second pad PD2 may be exposed without being covered by the interlayer insulating layer ILD, the passivation layer PSV, the via layer VIA, the bank BNK, and the thin film encapsulation layer TFE. The exposed second pad PD2 may be electrically connected to a corresponding third pad PD3 of the circuit board FPCB by the conductive adhesive member ACF.

According to some embodiments, one end of the (2-1)-th sub-line LP2*a* may be electrically and/or physically connected to the second pad PD2 through a sixth contact hole CH6. For example, as shown in FIG. 12, one end of the (2-1)-th sub-line LP2*a* may be electrically and/or physically connected to the second pad PD2 through the sixth contact hole CH6 that sequentially passes through the buffer layer BFL, the gate insulating layer GI, and the interlayer insulating layer ILD. In some embodiments, as shown in FIG. 13, when the second pad PD2 is the second conductive layer CL2, the (2-1)-th sub-line LP2*a* may be electrically and/or physically connected to the second pad PD1 through the sixth contact hole CH6 sequentially penetrating the buffer layer BFL and the gate insulating layer GI.

The other end of the (2-1)-th sub-line LP2*a* may be electrically and/or physically connected to the (2-2)-th sub-line LP2*b* through a fourth contact hole CH4. For example, as shown in FIG. 12 and FIG. 13, the other end of the (2-1)-th sub-line LP2*a* may be electrically and/or physically connected to the (2-2)-th sub-line LP2*b* through the fourth contact hole CH4 sequentially penetrating the gate insulating layer GI and the buffer layer BFL.

One end of the (2-2)-th sub-line LP2*b* may be electrically and/or physically connected to the (2-1)-th sub-line LP2*a* through the fourth contact hole CH4.

The other end of the (2-2)-th sub-line LP2*b* may be electrically and/or physically connected to the (2-3)-th sub-line LP2*c* through a fifth contact hole CH5. For example, as shown in FIG. 12 and FIG. 13, the other end of the (2-2)-th sub-line LP2*b* may be electrically and/or physically connected to the (2-3)-th sub-line LP2*c* through the fifth contact hole CH5 penetrating the interlayer insulating layer ILD.

According to some embodiments, one end of the (2-3)-th sub-line LP2*c* may be electrically and/or physically connected to the (2-2)-th sub-line LP2*b* through the fifth contact hole CH5. The other end of the (2-3)-th sub-line LP2*c* may be electrically and/or physically connected to the data line DL of the corresponding pixel PXL. The data line DL may be the third conductive layer CL3 provided and/or formed on the interlayer insulating layer ILD. In this case, the (2-3)-th sub-line LP2*c* may be integrally formed with the data line DL, and may be regarded as an area of the data line DL.

Each of the (2-1)-th, (2-2)-th, and (2-3)-th sub-lines LP2*a*, LP2*b*, and LP2*c* may extend in a direction parallel to the second direction DR2. Accordingly, each of the (2-1)-th, (2-2)-th, and (2-3)-th sub-lines LP2*a*, LP2*b*, an LP2*c* may configure a straight line portion of the second fan-out line LP2.

According to some embodiments, the (2-2)-th sub-line LP2*b* may directly contact the (2-1)-th sub-line LP2*a* through the fourth contact hole CH4 to be electrically connected to the (2-1)-th sub-line LP2*a*. The (2-3)-th sub-line LP2*c* may directly contact the (2-2)-th sub-line LP2*b* through the fifth contact hole CH5 to be electrically connected to the (2-2)-th sub-line LP2*b*. In addition, the second pad PD2 may directly contact the (2-1)-th sub-line LP2*a* through the sixth contact hole CH6 to be electrically connected to the (2-1)-th sub-line LP2*a*. The above-described second pad PD2, (2-1)-th sub-line LP2*a*, (2-2)-th sub-line LP2*b*, and (2-3)-th sub-line LP2*c* may be electrically connected to each other.

When a signal (e.g., a set or predetermined signal) (for example, a data signal) is applied from the driver DIC to the second pad PD2, the signal may be transmitted to the data line DL of the corresponding pixel PXL through the second pad PD2, the (2-1)-th sub line LP2*a*, the (2-2)-th sub-line LP2*b*, and the (2-3)-th sub-line LP2*c*.

In the second fan-out line LP2, a length L4 in an extension direction of the (2-1)-th sub-line LP2*a* (hereinafter referred to as a "fourth length"), a length L5 in an extension direction of the (2-2)-th sub-line LP2*b* (hereinafter, referred to as a "fifth length"), and a length L6 in an extension direction of the (2-3)-th sub-line LP2*c* (hereinafter, referred to as a "sixth length") may be different from each other, but the present disclosure is not limited thereto. In some embodiments, in the second fan-out line LP2, the fourth length L4 of the (2-1)-th sub-line LP2*a*, the fifth length L5 of the (2-2)-th sub-line LP2*b*, and the sixth length L6 of the (2-3)-th sub-lines LP2*c* may be equal to each other. In addition, according to some embodiments, in the second fan-out line LP2, at least two sub-lines of the fourth length L4 of the (2-1)-th sub-line LP2*a*, the fifth length L5 of the (2-2)-th sub-line LP2*b*, and the sixth length L6 of the (2-3)-th sub-lines LP2*c* may be the same, and the other sub-line thereof may be different from the two sub-lines thereof, but the present disclosure is not limited thereto.

A width W1 of the (2-1)-th sub-line LP2*a* (for example, a width in a direction crossing the extension direction of the (2-1)-th sub-line LP2*a*), a width W2 of the (2-2)-th sub-line LP2*b* (for example, a width in a direction crossing the extension direction of the (2-2)-th sub-line LP2*b*), and a width W3 of the (2-3)-th sub-lines LP2c (for example, a width in a direction crossing the extension direction of the (2-3)-th sub-lines LP2c) may be different from each other. For example, as shown in FIG. 14, the width W1 of the (2-1)-th sub-line LP2a positioned in the lowermost layer among the (2-1)-th, (2-2)-th, and (2-3)-th sub-lines LP2a, LP2b, and LP2c may be designed to be the largest. When the width W1 of the (2-1)-th sub-line LP2a is the largest, the buffer layer BFL and the gate insulating layer GI positioned on the (2-1)-th sub-line LP2a have a flat surface profile on the (2-1)-th sub-line LP2a, so that the (2-2)-th sub-line LP2b positioned on the gate insulating layer GI may have a flat surface. When the width W1 of the (2-1)-th sub-line LP2a is larger than the width W2 of the (2-2)-th sub-line LP2b, the (2-2)-th sub-line LP2b may completely overlap the (2-1)-th sub-line LP2a.

In addition, the width W2 of the (2-2)-th sub-line LP2b may be designed to be larger than the width W3 of the (2-3)-th sub-line LP2c. In this case, the interlayer insulating layer ILD positioned on the (2-2)-th sub-line LP2b has a flat surface profile on the (2-2)-th sub-line LP2b, so that the (2-3) sub-line LP2c positioned on the interlayer insulating layer ILD may have a flat surface.

In the above-described embodiments, it has been described that the (2-1)-th, (2-2)-th, and (2-3)-th sub-lines LP2a, LP2b, and LP2c have different widths, but embodiments according to the present disclosure are not limited thereto. According to some embodiments, the (2-1)-th, (2-2)-th, and (2-3)-th sub-lines LP2a, LP2b, and LP2c may have the same width as each other.

According to some embodiments, the width W1 and/or the fourth length L4 of the (2-10-th sub-line LP2a, the width W2 and/or the fifth length L5 of the (2-2)-th sub-line LP2b, and the width W3 and/or the sixth length L6 of the (2-3)-th sub-line LP2c may be variously changed within a range having the same (or substantially similar) wire length L and the same (or substantially similar) wire resistance as the first fan-out line LP1.

According to some embodiments, the wire length L of the second fan-out line LP2 by adding all of the fourth length L4 of the (2-1)-th sub-line LP2a, the fifth length L5 of the (2-2)-th sub-line LP2b, and the sixth length L6 of the (2-3)-th sub-lines LP2c may be the same as or substantially similar to the wire length L of the first fan-out line LP1. In addition, the wire resistance of the second fan-out line LP2 may be the same as the wire resistance of the first fan-out line LP1.

The fourth, fifth, and sixth contact holes CH4, CH5, and CH6 may not correspond to each other. For example, the fourth contact hole CH4 may be positioned so as not to correspond to the fifth and sixth contact holes CH5 and CH3 in the fan-out area FTA, the fifth contact hole CH5 may be positioned so as not to correspond to the fourth and sixth contact holes CH4 and CH6 in the fan-out area FTA, and the sixth contact hole CH6 may be positioned so as not to correspond to the fourth and fifth contact holes CH4 and CH5 in the fan-out area FTA. However, the present disclosure is not limited thereto, and in some embodiments, the fourth, fifth, and sixth contact holes CH4, CH5, and CH6 may be positioned to correspond to each other in the fan-out area FAT.

Each of the positions of the fourth, fifth, and sixth contact holes CH4, CH5, and CH6 in the non-display area NDA may correspond to an area OVA' in which two of the (2-1)-th, (2-2)-th, and (2-3)-th sub-lines LP2a, LP2b, and LP2c and the second pad PD2 that directly contact and are electrically connected to each other overlap each other.

In the non-display area NDA, the sixth contact hole CH6 may be positioned to correspond to one area of an overlapping area OVA1' (hereinafter referred to as a "(1-2)-th overlapping area") in which one end of the (2-1)-th sub-line LP2a and the second pad PD1 overlap each other. In addition, in the non-display area NDA, the fourth contact hole CH4 may be positioned to correspond to one area of an overlapping area OVA2' (hereinafter referred to as a "(2-2)-th overlapping area") in which the (2-1)-th sub-line LP2a and the (2-2)-th sub-line LP2b overlap each other. Additionally, in the non-display area NDA, the fifth contact hole CH5 may be positioned to correspond to one area of an overlapping area OVA3' (hereinafter referred to as a "(3-2)-th overlapping area") in which the (2-2)-th sub-line LP2b and the (2-3)-th sub-line LP2c overlap each other.

A size of the (1-2)-th overlapping area OVA1', a size of the (2-2)-th overlapping area OVA2', and a size of the (3-2)-th overlapping area OVA3' may be different from each other, but are not limited thereto.

According to some embodiments, the size of the (2-2)-th overlapping area OVA2' may be larger than the (2-1)-th overlapping area OVA2, and the size of the (3-2)-th overlapping area OVA3' may be larger than the (3-1)-th overlapping area OVA3.

According to some embodiments, the first fan-out line LP1 may be positioned relatively outside the fan-out area FTA compared with the second fan-out line LP2. Accordingly, the first fan-out line LP1 may be configured to include an oblique portion in the fan-out area FTA, and the second fan-out line LP2 may be configured to include only a straight line portion in the fan-out area FTA.

In an existing display device, a difference in wire length may occur between some fan-out lines positioned at an outermost of the fan-out area and some fan-out lines positioned at a center of the fan-out area. Due to the difference in wire length, a resistance deviation between the fan-out lines may occur. For example, as the non-display area becomes narrower, the above-described resistance deviation may further increase according to the positions of the fan-out lines. For example, as the non-display area becomes narrower, a resistance deviation between some fan-out lines positioned at the outermost of the fan-out area and some fan-out lines positioned at the center of the fan-out area may further increase. Due to the resistance deviation between the fan-out lines, distortion may occur in the signal transmitted (or supplied) to the pixels, so that light emission uniformity between adjacent pixels may deteriorate.

Accordingly, according to some embodiments, in order that the fan-out lines LP, for example, the first and second fan-out lines LP1 and LP2 have the same (or substantially similar) wire length L and the same (or substantially similar) wire resistance, so as to reduce (or minimize) the size of the overlapping area OVA between two constituent elements directly contacting through a corresponding contact hole among the (1-1)-th, (1-2)-th, and (1-3)-th sub-lines LP1a, LP1b, and LP1c of the first fan-out line LP1, and so as to secure the maximum size of the overlapping area OVA' between two constituent elements directly contacting through a corresponding contact hole among the (2-1)-th, (2-2)-th, and (2-3)-th sub-lines LP2a, LP2b, and LP2c of the second fan-out line LP2, the first and second fan-out lines LP1 and LP2 may be designed.

When the overlapping area OVA' between the (2-1)-th, (2-2)-th, and (2-3)-th sub-lines LP2a, LP2b, and LP2c is secured as much as possible, by intentionally long forming each of the fourth length L4, the fifth length L5, and the sixth length L6 of the (2-1)-th, (2-2)-th, and (2-3)-th sub-lines LP2a, LP2b, and LP2c that are sequentially stacked and overlap each other in the second fan-out line LP2 with at least one insulating layer interposed therebetween, the second fan-out line LP2 may have the same or substantially similar wire length L and wire resistance as the first fan-out line LP1.

In the second fan-out line LP2, by long forming the fourth and fifth lengths L4 and L5 of the (2-1)-th and (2-2)-th sub-lines LP2a and LP2b overlapping each other with the buffer layer BFL and the gate insulating layer GI interposed therebetween, the (2-2)-th overlapping area OVA2' may be secured as much as possible. In this case, the size of the (2-2)-th overlapping area OVA2' may be larger than the (2-1)-th overlapping area OVA2. In addition, in the second fan-out line LP2, by long forming the fifth and sixth lengths L5 and L6 of the (2-2)-th and (2-3)-th sub-lines LP2b and LP2c overlapping each other with the interlayer insulating layer ILD interposed therebetween, the (3-2)-th overlapping area OVA3' may be secured as much as possible. In this case, the size of the (3-2)-th overlapping area OVA3' may be larger than the (3-1)-th overlapping area OVA3.

In the above-described embodiments, it may be designed for each of the first and second fan-out lines LP1 and LP2 to be implemented in a multi-layered stack structure including the first conductive layer CL1, the second conductive layer CL2, and the third conductive layer CL3, and it may be designed so that the overlapping area OVA' of two conductive layers directly contacting through a corresponding contact hole among the first to third conductive layers CL1, CL2, and CL3 (or the (2-1)-th to (2-3)-th sub-lines LP2a, LP2b, and LP2c) in the second fan-out line LP2 is larger than the overlapping area OVA of two constituent elements directly contacting through a corresponding contact hole among the first to third conductive layers CL1, CL2, and CL3 (or the (1-1)-th to (1-3)-th sub-lines LP1a, LP1b, and LP1c) in the first fan-out line LP1. Accordingly, the wire length L of the first fan-out line LP1 positioned at the outermost portion of the fan-out area FTA may be the same as or substantially similar to the wire length L of the second fan-out line LP2 positioned at the center of the fan-out area FTA. In addition, the wire resistance of the first fan-out line LP1 and the wire resistance of the second fan-out line LP2 may be the same or substantially similar.

According to the above-described embodiments, even if the area of the non-display area NDA is reduced so that the fan-out lines LP include only an oblique portion or only a straight line portion or an oblique portion and straight line portion depending on the positions thereof and have different wire shapes on a plane, each of the fan-out lines LP is implement in a multi-layered structure in which the first to third conductive layers CL1, CL2, and CL3 are stacked and overlap each other, so that because the overlapping area between two constituent elements directly contacting each other through the corresponding contact hole among the first to third conductive layers CL1, CL2, and CL3 is designed differently for each fan-out line LP, all of the fan-out lines LP may have the same or substantially similar wire length and wire resistance.

As described above, when the wire resistance deviation between the fan-out lines LP is reduced, a relatively uniform signal may be applied to the pixels PXL electrically connected to the fan-out lines LP to adjacent pixels PXL so that the light emission uniformity between the adjacent pixels PXL may be improved. Accordingly, the display device DD (or the display panel DP) may display images with relatively improved quality and reliability.

While aspects of some embodiments of the present disclosure have been shown and described with reference to the figures, it will be understood by those skilled in the art that various changes in forms and details may be made therein without departing from the scope of embodiments according to the present disclosure as defined by the appended claims and their equivalents.

Therefore, the technical scope of embodiments according to the present disclosure may be determined based on the technical scope of the accompanying claims, and their equivalents.

What is claimed is:

1. A display device comprising:
a substrate including a display area having a plurality of pixels, a pad area having a plurality of pads, and a non-display area including a fan-out area between the display area and the pad area;
a first fan-out line in the fan-out area;
a second fan-out line in the fan-out area and electrically disconnected from the first fan-out line;
first, second, and third insulating layers sequentially arranged on the substrate; and
a first conductive layer between the substrate and the first insulating layer, a second conductive layer between the second insulating layer and the third insulating layer, and a third conductive layer on the third insulating layer,
wherein the first fan-out line is closer to an edge of the non-display area than the second fan-out line,
each of the first and second fan-out lines has a multi-layered stacking structure in which a first sub-line, a second sub-line, and a third sub-line provided in different layers are stacked, and
an amount of overlap between at least two of the first sub-line, the second sub-line, or the third sub-line of the second fan-out line is greater than an amount of overlap between at least two from among the first sub-line, the second sub-line, or the third sub-line of the first fan-out line such that the first fan-out line and the second fan-out line have a same length as each other and the first fan-out line and the second fan-out line have a same resistance.

2. The display device of claim 1, wherein
the first sub-line includes the first conductive layer, the second sub-line includes the second conductive layer, and the third sub-line includes the third conductive layer.

3. The display device of claim 2, wherein
in each of the first and second fan-out lines, the first sub-line and the second sub-line overlap each other with the first and second insulating layers therebetween, and the second sub-line and the third sub-line overlap each other with the third insulating layer therebetween.

4. The display device of claim 3, wherein
in each of the first and second fan-out lines, the first sub-line and the second sub-line are electrically connected through a first contact hole penetrating the first and second insulating layers, and
in each of the first and second fan-out lines, the second sub-line and the third sub-line are electrically connected through a second contact hole penetrating the third insulating layer.

5. The display device of claim 4, wherein
in each of the first and second fan-out lines, the second sub-line directly contacts the first sub-line through the first contact hole, and in each of the first and second fan-out lines, the third sub-line directly contacts the second sub-line through the second contact hole.

6. The display device of claim 5, wherein in each of the first and second fan-out lines, the first contact hole and the second contact hole do not correspond to each other.

7. The display device of claim 5, wherein an overlapping area of the first sub-line and the second sub-line of the second fan-out line is larger than an overlapping area of the first sub-line and the second sub-line of the first fan-out line, and an overlapping area of the second sub-line and the third sub-line of the second fan-out line is larger than an overlapping area of the second sub-line and the third sub-line of the first fan-out line.

8. The display device of claim 7, wherein the pads include:

at least one first pad electrically connected to the first sub-line of the first fan-out line; and at least one second pad electrically connected to the second sub-line of the second fan-out line, and the first and second pads include one of the first conductive layer, the second conductive layer, and the third conductive layer.

9. The display device of claim 8, wherein the first and second pads include the third conductive layer, and are on a same layer as the third sub-line of each of the first and second fan-out lines.

10. The display device of claim 9, wherein the first sub-line of the first fan-out line and the first pad are electrically connected through a third contact hole penetrating the first insulating layer, the second insulating layer, and the third insulating layer; and the first sub-line of the second fan-out line and the second pad are electrically connected through a fourth contact hole penetrating the first insulating layer, the second insulating layer, and the third insulating layer.

11. The display device of claim 10, wherein the first pad is in direct contact with the first sub-line of the first fan-out line through the third contact hole, and the second pad is in direct contact with the first sub-line of the second fan-out line through the fourth contact hole.

12. The display device of claim 8, wherein the first and second pads include the second conductive layer, and are on a same layer as the second sub-line of each of the first and second fan-out lines.

13. The display device of claim 12, wherein the first sub-line of the first fan-out line and the first pad are electrically connected through a third contact hole penetrating the first and second insulating layers, and the first sub-line of the second fan-out line and the second pad are electrically connected through a fourth contact hole penetrating the first and second insulating layers.

14. The display device of claim 8, wherein in the second fan-out line, each of the first sub-line, the second sub-line, and the third sub-line extends in one direction, and a width of the first sub-line in a direction crossing the one direction is larger than that of the second and third sub-lines.

15. The display device of claim 14, wherein in the second fan-out line, a size of an overlapping area of the first sub-line and the second sub-line is different from a size of an overlapping area of the second sub-line and the third sub-line.

16. The display device of claim 14, wherein in the second fan-out line, the second sub-line completely overlaps the first sub-line with the first and second insulating layers therebetween.

17. The display device of claim 14, wherein in the first fan-out line, the first sub-line, the second sub-line, and the third sub-line extend in an oblique direction inclined to the one direction.

18. The display device of claim 7, further comprising:

a driver positioned in the non-display area and electrically connected to each of the first and second fan-out lines; and data lines electrically connected to the driver to transmit a data signal to each of the pixels, and wherein the third sub-line of each of the first and second fan-out lines is integral with a corresponding one of the data lines.

19. A display device comprising:

a substrate including a display area having a plurality of pixels, a pad area having a plurality of pads, and a non-display area including a fan-out area between the display area and the pad area;

a first fan-out line in the fan-out area;

a second fan-out line in the fan-out area and electrically disconnected from the first fan-out line;

first, second, and third insulating layers sequentially arranged on the substrate; and a first conductive layer between the substrate and the first insulating layer, a second conductive layer between the second insulating layer and the third insulating layer, and a third conductive layer on the third insulating layer, wherein the first fan-out line is closer to an edge of the non-display area than the second fan-out line, each of the first and second fan-out lines has a multi-layered stacking structure in which a first sub-line, a second sub-line, and a third sub-line that are in different layers and electrically connected are stacked, and in each of the first and second fan-out lines, the first sub-line and the second sub-line overlap each other, and the second sub-line and the third sub-line overlap each other an amount of overlap between at least two of the first sub-line, the second sub-line, or the third sub-line of the second fan-out line is greater than an amount of overlap between at least two from among the first sub-line, the second sub-line, or the third sub-line of the first fan-out line such that the first fan-out line and the second fan-out line have a same resistance.

20. The display device of claim 19, wherein a size of an overlapping area of the first sub-line and the second sub-line is different from a size of an overlapping area of the second sub-line and the third sub-line.

* * * * *